United States Patent [19]

Andros et al.

[11] Patent Number: 5,052,049
[45] Date of Patent: Sep. 24, 1991

[54] PAGING RECEIVER WITH CONTINUOUSLY TUNABLE ANTENNA

[75] Inventors: Andrew A. Andros, Spring, Tex.; Thomas J. Campana, Jr., Chicago, Ill.

[73] Assignee: Telefind Corporation, Coral Gables, Fla.

[21] Appl. No.: 381,527

[22] Filed: Jul. 18, 1989

Related U.S. Application Data

[63] Continuation-in-part of Ser. No. 110,514, Oct. 20, 1987, Pat. No. 4,851,830.

[51] Int. Cl.⁵ .............................................. H04B 1/18
[52] U.S. Cl. ..................................... 455/186; 455/193; 340/825.44; 343/718
[58] Field of Search ................. 455/193, 186, 54, 164, 455/173, 188, 176, 192, 195, 269, 341, 182, 184, 191; 340/825.44; 343/145, 718, 720

[56] References Cited

U.S. PATENT DOCUMENTS

| | | | |
|---|---|---|---|
| 3,703,685 | 11/1972 | Simopoulos | 325/373 |
| 4,223,406 | 9/1980 | Someno | 455/180 |
| 4,291,414 | 9/1981 | Kimura | 455/164 |
| 4,418,428 | 11/1983 | Evans | 455/180 |
| 4,426,732 | 1/1984 | Mori | 455/263 |
| 4,686,708 | 8/1987 | Oki et al. | 455/280 |
| 4,704,734 | 11/1987 | Menich et al. | 455/277 |
| 4,723,302 | 2/1988 | Fulmer et al. | 455/186 |
| 4,817,196 | 3/1989 | MacNak et al. | 455/193 |
| 4,862,516 | 8/1989 | Macnak et al. | 455/193 |
| 4,868,885 | 9/1989 | Perry | 455/52 |

FOREIGN PATENT DOCUMENTS

0161545 11/1985 European Pat. Off. .

Primary Examiner—Reinhard J. Eisenzopf
Assistant Examiner—Lisa Charonel
Attorney, Agent, or Firm—Antonelli, Terry, Stout & Kraus

[57] ABSTRACT

A paging receiver (10) is disclosed which is compatible with transmissions from analog or digital paging transmitters. The paging receiver has a command structure which permits it to be dynamically programmable to change its functionality including programming of the channel frequencies which the paging receiver is to receive. The programmability of the channel frequencies permits the paging receiver to be used for making national, regional, remote area, local area, and sublocal area pages, and pages to a group in the local area and to switch from channel frequencies which are heavily used during peak paging times to lesser used channels. The paging receiver transmits the paging receiver identification code digits in an order of increasing significance which significantly lessens power consumption for all paging receivers tuned to a particular frequency for determining if a page is to be received which prolongs paging receiver battery life. The paging receiver displays the place of origin of pages as either being of local origin or from other areas. The paging receiver antenna (12) is continuously tunable to permit compensation for variation in antenna gain caused by environmental factors which can seriously degrade signal strength.

70 Claims, 23 Drawing Sheets

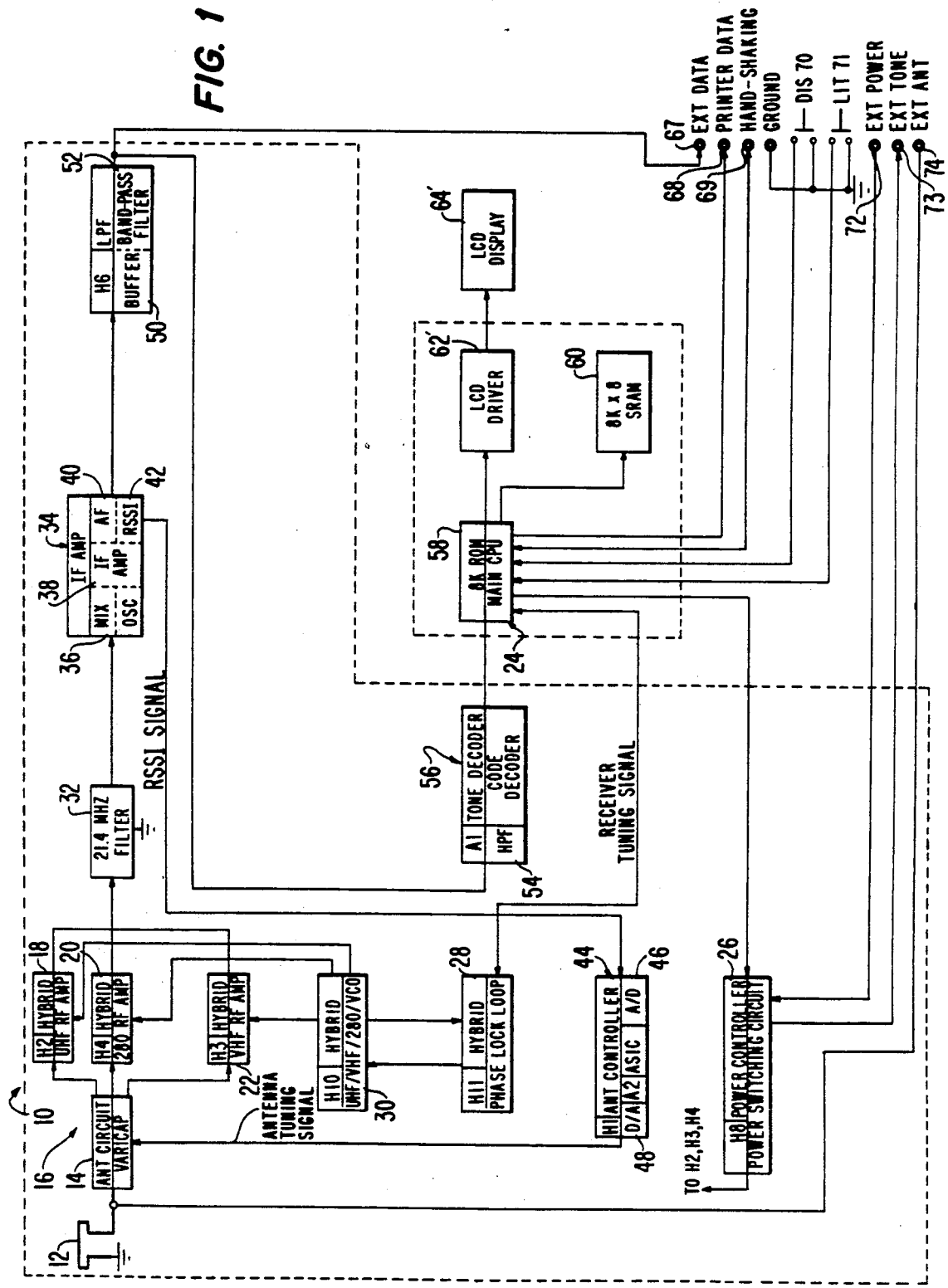

ORDER OF CHANNEL RECEPTION

PAGING RECEIVER WITH CONTINUOUSLY TUNABLE ANTENNA

CROSS REFERENCE TO RELATED APPLICATIONS

This application is a Continuation-In-Part of U.S. patent patent application Ser. No. 110,514, entitled "Paging Receiver With Continuously Tunable Antenna", filed Oct. 20, 1987 now U.S. Pat. No. 4,851,830. Reference is made to U.S. application Ser. No. 381,483, entitled "Paging Receiver With Continously Tunable Antenna and RF Amplifier", filed on even date herewith. The aforementioned applications are incorporated herein by reference in their entirety.

DESCRIPTION

1. Technical Field:

The present invention relates to RF paging receivers.

2. Background Art:

Paging systems are in use throughout the world. There are paging systems which transmit pages from satellite transmitters to different cities. An example of such a system is that operated by National Satellite Paging which transmits only numeric pages. A system operated by Metrocast permits pages to be transmitted to any city within the system through dedicated communication links between the cities. In the Metrocast system, pages to be transmitted locally are exclusively made by calling into the city where the page is to be made by a local telephone call. A page to be made on a regional basis is called in by an 800 number telephone call to a central facility in San Diego from which the page is transmitted to the city where the page is to be broadcast by the dedicated communication link. The page is received from the communication link at the city where it is to be broadcast and then broadcasted locally by an existing paging service to transmit the page to the person to be paged.

To date, there is no existing national paging system which substantially covers the geographical United States. Because of the cost of hardware, a system like the Metrocast system is not economical in small cities or rural areas where the paging volume is relatively low. Accordingly, while the objective of achieving nationwide paging has been attempted for many years, no existing system integrates local and national paging substantially throughout the geographical United States or throughout the world. The vast majority of paging systems operate totally locally with each system having a limited functionality because of its inability to deliver regional paging. Most paging receivers are tuned to receive only a single channel which inherently limits usage in time frames when heavy paging conditions exist in a local paging system and further prevent usage in other geographical locations where other channels are used.

Typically each existing paging system has unique specifications which prevents operation of one paging receiver in other systems. For example, the paging receiver identification codes are not universal. Furthermore, existing paging receivers will only receive transmissions from a single type of transmitter (analog or digital) systems. As a result of paging receivers differing in design and operation, the cost of paging receivers is higher as a result of smaller manufacturing volumes than would be realized if a single paging receiver was usable for a worldwide network.

Paging receivers in the Metrocast system cyclically scan a plurality of closely spaced channels to detect the presence of a page for the paging receiver on any one of the closely spaced channels. This paging receiver suffers from the inherent disadvantage that the continual scanning of the closely spaced channels requires a substantial power consumption causing the batteries of the pager to have a short life span. Short battery life increases the cost of operation and can cause pages to be lost when the batteries are not promptly replaced.

All paging systems currently issue a paging receiver identification code to each of the paging receivers for purposes of providing a unique identification. There currently is no universal standard for issuing identification numbers to pagers, with the largest system having capacity for issuing only 2,000,000 paging receiving identification codes. Worldwide, there currently are over 12,000,000 pagers in use with projected growth on an annual basis in the paging industry exceeding 20%. Thus, current paging systems do not permit a worldwide paging system to be realized as a result of the actual and projected number of pagers being far larger than the capacity of the identification codes in the largest existing paging system.

All pagers currently monitor the one or more channels which they are designed to receive to detect if a paging receiver identification code accompanying a page on the one or more channels on which they are designed to receive matches a stored paging receiver identification code. If a match exists, then a page is processed and an alarm and a display of the message is made to alert the wearer of the paging receiver of the message contained with the page. These systems transmit the pager identification code in an order of decreasing significance of the digits of the identification code. In other words, if a paging receiver has the identification code 12345, the transmitter precedes the transmission of the page with the sequence of digits 12345. Each pager which receives the channel on which the paging receiver identification code is transmitted continually detects each of the successive digits and maintains its radio frequency receiver on until a mismatch is found between the transmitted and stored paging receiver identification code digits. As a result of the fact that many paging receivers have identification codes in which their more significant digits are common to other paging receivers within a system, a substantial amount of battery power is consumed detecting if a page is intended for a particular paging receiver. Each paging receiver which receives the digits of the paging receiver identification code in an order of decreasing significance is statistically likely to have its radio frequency receiver turned on for most of the transmission of the digits of the paging receiver identification code until the lesser significant digits of the paging receiver identification code are received for the reason that it is the lesser significant paging receiver identification code digits which distinguish one paging receiver from another and only the least significant digit which distinguishes the paging receiver which is desired to receive a particular page from all other paging receivers. Accordingly, the transmission of the paging receiver identification code digits in an order of decreasing significance substantially increases power consumption lessening the life of the batteries of the paging receiver.

Throughout the world different frequency bands have been adopted for transmitting pages. In the United States, transmissions are authorized on VHF and UHF bands. In the United States, the channels of the VHF and UHF bands are separated by 5 KHz steps. Moreover, for each of these bands transmitters are in existence which transmit pages by frequency modulation of a digital carrier wave and other transmitters which transmit pages by frequency modulation of an analog carrier wave. Currently no paging receiver exists which is compatible with transmissions from both analog and digital transmitters. Furthermore, Europe has allocated VHF frequencies for paging with individual channel frequencies being separated by 6.25 KHz steps and Far Eastern countries has allocated paging frequencies on a 280 MHz VHF band with individual channel frequencies being separated by 2.5 KHz steps. Currently, no paging receivers exist which are operational on any more than one of the above-identified frequency bands. The inability of current paging receivers to receive pages on the different frequency bands allocated throughout the world prevents worldwide paging to be received on a single paging receiver.

None of the commercially marketed paging receivers are programmable by command to receive different channels which severely restricts the paging receivers to usage in limited geographical areas. In the United States there are a large number of paging frequencies in use in different geographical parts of the country. Because of the fact that the existing paging receivers cannot be programmed by command to receive different channels, it is impossible to universally receive pages throughout the country because of the fact that reception of channel frequencies is limited to a single channel frequency fixed upon obtaining the paging receiver from the paging service or to cyclically scan a group of closely spaced channels such as with the paging receiver used by the Metrocast system. Neither approach leads itself to being dynamically usable to accept pages in another geographical area where a different channel or channels are in use. The prior art paging receivers, inability to rapidly change the frequencies which may be received severely limits the usage of paging for business or other travel.

In the prior art as a consequence of paging receivers being designed to receive only a single channel in a particular frequency band or to scan a sequence of closely spaced channels, antenna gain has not been a problem in achieving reception of pages with sufficient signal strength to permit proper decoding and display of the page. Antenna tuning systems have been used to tune a receiver's antenna in military communication for maximum antenna gain prior to receiving communications. However, these systems do not tune antenna gain dynamically during the reception of the communication. When a paging receiver is used to accept multiple bands of channels, environmental characteristics such as variable inductance and capacitance which vary with location, will tend to prevent maximum antenna gain from being achieved especially when the paging receiver is being carried by a person in motion.

Currently, no paging system exists which truly permits paging on a national and international level. This is a consequence of the inability of the paging receivers to receive a large number of frequencies and further the deficiency of the existing systems in having a universal paging receiver identification code which uniquely identifies each of the paging receivers throughout the world with the possibility existing in the current systems of several pagers having the same paging receiver identification code. A universal paging receiver identification code is needed having the capacity to uniquely identify all of the paging receivers throughout the world.

Currently in the United States a relatively small number of channels are used in the large metropolitan areas where most of the paging traffic occurs. As paging traffic increases in view of the relatively small number of channels predominantly in use in metropolitan areas, there is the likelihood that message traffic during the three peak paging periods that occur each day will increase to the point where the predominantly used small number of channels will become so busy that it is impossible to rapidly transmit pages to a paging receiver. Because of the fact that current paging receivers are not programmable by remote command to receive pages on different channels, existing networks do not have the ability to dynamically switch channels in large metropolitan areas, when one channel becomes so busy that rapid paging is not possible, to another lesser used channel to eliminate delays in transmitting pages to a paging receiver. In fact, in large metropolitan areas there currently are VHF and UHF mobile channels that are currently under utilized due to the current cellular radio system which could be used as alternative paging channels to receive traffic on commonly used stations.

FM analog and digital paging protocols exist. Existing protocols for the FM analog and digital paging systems do not have a high efficiency in transmitting data per transmitted code. Existing digital transmitters modulate a digital FM transmitter with a binary signal which utilizes frequency shift keying of the basic carrier signal to transmit high levels of a bit with a burst of the shifted frequency and the low level bit with the unshifted frequency of the carrier. Thus, each identifiable digit of the transmission from an FM digital paging transmitter can encode only two distinct levels for each frequency burst of the carrier. Analog FM paging transmitters frequency modulate a sinusoidal carrier with a total of 15 tones to create a hexadecimal value transmitting system in which no modulation of the basic carrier frequency is considered to be the "F" level and the remaining 15 different levels are encoded by modulating the FM carrier with distinct tones. Paging receivers which are designed to receive analog transmissions require substantial reception time of each tone to validly detect each character. Thus, while the protocol of FM analog paging transmitters transmits a much higher number of data levels for each frequency burst, the slowness of the paging receivers in detecting the discrete tones does not result in a high throughput speed of transmitting characters.

Existing paging systems which permit paging in multiple cities suffer from the deficiency that a long distance phone call is required to phone in a page which is to be transmitted to a remote city. Because of the fact that the long distance phone call is charged to the person wishing to make the page or to the operator of the system (800 service), the expense of using these paging systems is increased and may discourage users from making non-local pages. No. national or regional prior art paging system permits a page to be initiated from a geographic area outside the area where the paging receiver is normally located by the making of a local phone call and further for the paging receiver to be programmed to receive the page on a particular frequency found at the location where the page is to be received.

Current paging receivers do not execute a repertoire of commands permitting the functional characteristics of the paging receiver to be programmed dynamically by RF transmission. Current paging receivers do respond to commands which provide an alarm to the person wearing the paging receiver that a page has been received such as activating a display and/or providing an audio alarm. However, current paging receivers do not execute a diversity of commands in which the system influences operation and structure of the paging receiver, including commands activating the display to indicate if the page has originated locally or from another region, causing the message transmitted with the page to be stored in a particular memory location in the paging receiver and programming the channel son which the paging receiver is to receive pages and permitting the paging receiver to serve as a relay for pages either to be transmitted or received.

Moreover, the prior art paging receivers do not control the scanning of channels in accordance with a program which automatically causes the RF receiver to monitor the channel on which the last page was received for a predetermined time interval and if no carrier is detected on that channel then scanning one or more additional programmed channels for a predetermined time interval until either a carrier is detected on one of the channels being scanned in which case that channel is scanned for the predetermined time interval or in the absence of any carrier being detected on the one or more channels being scanned shutting down the RF receiver after the predetermined time interval. No prior art paging system is known in which a code is transmitted with the paging receiver identification code to restrict reception of pages in particular geographic areas.

Cellular radio systems dynamically assign channels on which cellular radio receivers are to receive telephone calls. To make or receive a telephone call, a mobile cellular radio is locked onto a set up channel through communications with the transmitter which are established when the cellular radio receiver is turned on. The cellular system then assigns the mobile cellular radio to a specific channel while the mobile cellular radio is making or receiving a telephone call within a cell. As the cellular radio receiver moves from one cell to another cell, the channel is dynamically changed from one channel to another channel to maintain a strong signal. A cellular radio receiver does not have a channel memory which stores channels which are to be scanned to establish if a call is forth coming. The dynamic assignment of a channel is initiated by the transmitter for the sole purpose of establishing the channel over which voice communications are to be initiated or to be maintained when moving from one cell to another.

U.S. Pat. No. 4,422,071 discloses a system for programming an identification code of a receiver by a radio frequency communication between a transmitter and the receiver.

DISCLOSURE OF INVENTION:

The present invention provides the first paging receiver which is compatible with all existing UHF and VHF paging frequency bands and existing paging system FM analog and digital transmitters found in the United States, Japan and Europe. A paging receiver in accordance with the present invention may be programmed dynamically to receive channels in multiple bands including the VHF and UHF bands in the United States, the VHF band in Europe and the 280 VHF Japanese band. The dynamic programmability of channels of the paging receiver of the present invention permits operation in all of the geographic areas identified above with a single paging receiver by programming the paging receiver by a channel programming command to receive one or more channels in the geographic areas to which the pager will be transported. The transmitter transmitting the page in the area where the paging receiver is to receive the page transmits the page on a frequency on which the paging receiver has been dynamically programmed to receive the page.

The paging receiver of the present invention and its protocol is compatible with all existing analog and digital transmitters and permits pages transmitted by either analog or digital paging transmitters to be received by a single paging receiver with total transparency to the user of the paging receiver. Furthermore, the adoption of a universal protocol in which each code transmission by a FM digital transmitter encodes multiple values of signals greater than two achieves a high data throughput rate. Moreover, the signal processing circuitry of the paging receiver provides a rapid response time to each transmitted code from either an analog or digital transmitter which further permits the time duration of transmission of each character to be shortened providing a high data throughput. Finally, in accordance with a preferred embodiment of the present invention, a paging receiver identification code format is adopted which permits 100,000,000 distinct paging receivers to be used by the system enabling international use.

The present invention substantially enhances the battery life of batteries used to power the paging receiver. In the first place, each digit of the paging receiver identification code is transmitted as a header on each page in an order of increasing significance of the paging receiver identification code digits. The paging receiver compares each received paging receiver identification code digit with the corresponding digits of its unique stored paging receiver identification code to detect if a mismatch exists at which time the paging receiver tuner is turned off to conserve power until it is turned on again under a control program of the main central processing unit. The comparison of the transmitted paging receiver identification code digits and the stored pager receiver identification code digits continues sequentially until either a total match is found at which time the command and/or page transmitted with the paging receiver identification code is processed or the paging receiver tuner is shut down to conserve power.

Furthermore, reception of pages by a particular paging receiver may be restricted by use of a designation code. Each paging receiver contains a memory for storing a destination code. Pages which are to be received on an area basis by a paging receiver are transmitted with the destination code being the first digit of the transmission of the paging receiver identification code. If a match is not found between the transmitted destination code and any stored destination code contained in the memory of the paging receiver, the paging receiver tuner is immediately shut down to conserve power. If a match is found between a transmitted destination code and any stored destination code, the paging receiver then processes the subsequently transmitted paging receiver identification code digits which are transmitted in an order of increasing significance of its digits as described above. The invention eliminates the problem of each paging receiver which is to receive a national or regional page from responding to resident local paging which consumes substantial amounts of battery life.

Furthermore, in accordance with the invention, each paging receiver contains a memory for storing the last channel on which a carrier was detected. The control program of the main central processing unit for the paging receiver automatically activates the paging receiver to receive the last channel first because of the statistical probability that pages are more likely to be found on that channel than on additional channels stored in a channel memory which are thereafter received by the paging receiver in an order determined by a control program. Battery life is enhanced by ordering the sequence in which channels are to be received such that the statistically most likely channel on which a transmission is likely to be received is the first channel received when a plurality of channels are to be scanned for the presence of a carrier.

The diverse command repertoire of the paging receiver further enhances its usage by permitting programming of channels, processing of storage location of pages in memory, place of origin display of pages, use of the paging receiver to relay pages to external devices and regional or group specific reception of pages.

BRIEF DESCRIPTION OF DRAWINGS:

FIG. 1 is a block diagram of a preferred embodiment of a paging receiver in accordance with the present invention.

BEST MODE FOR CARRYING OUT THE INVENTION:

I. Paging Receiver Architecture

Figure 7:
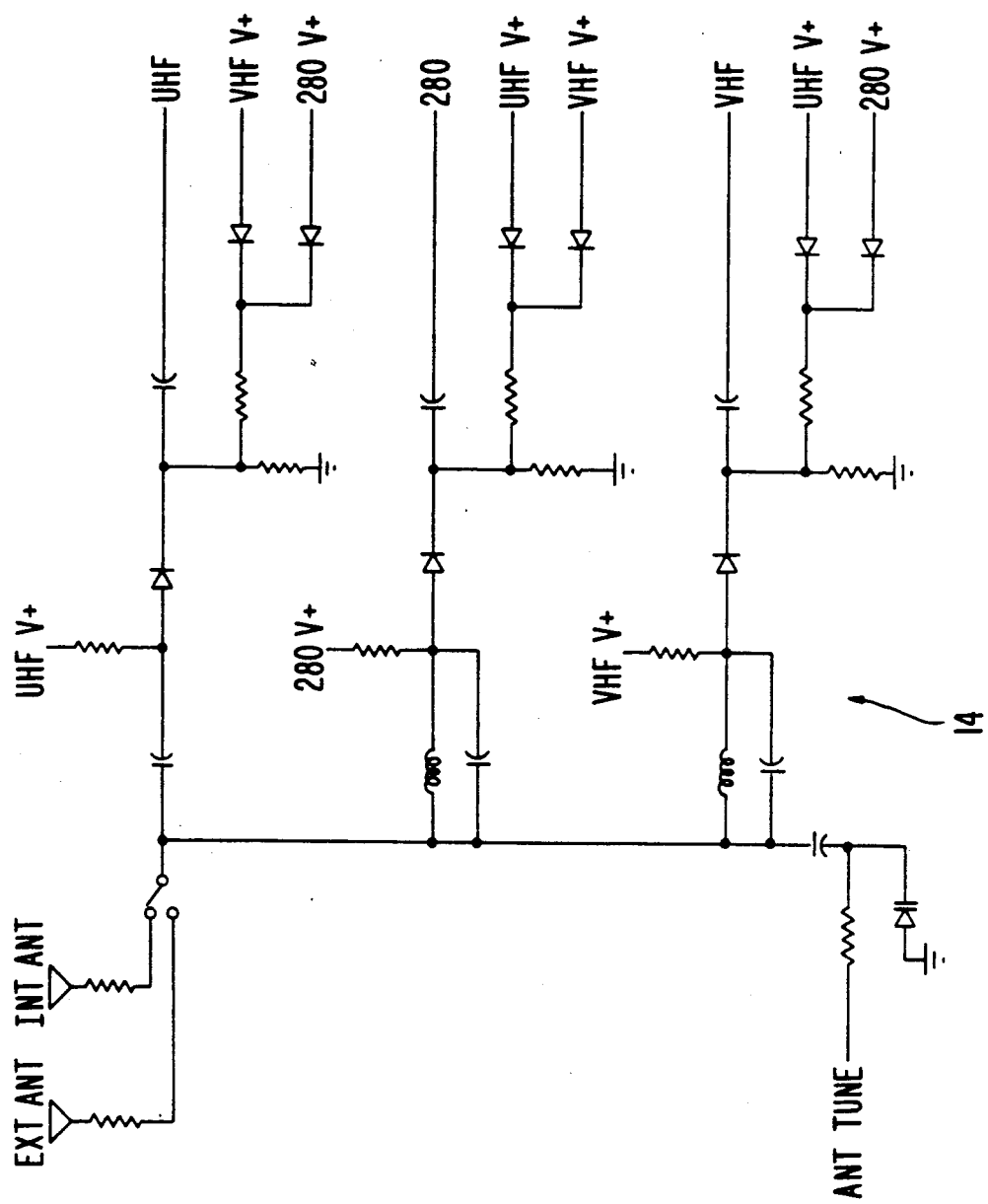
FIG. 7 is a circuit schematic of the antenna circuit 14 of FIG. 1.
Figure 8:
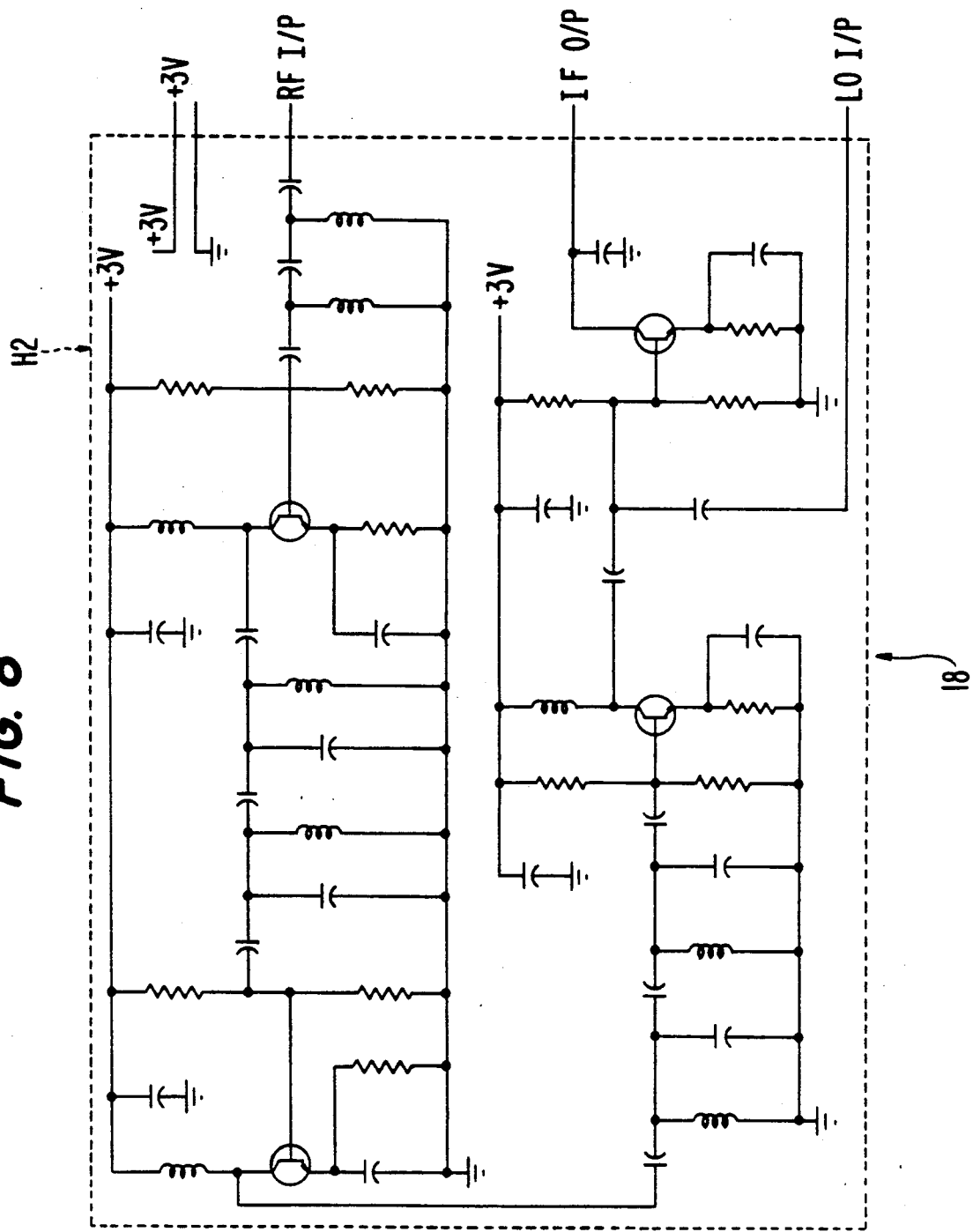
FIG. 8 is a circuit schematic of the amplifier and mixer 18 of FIG. 1.
Figure 9:
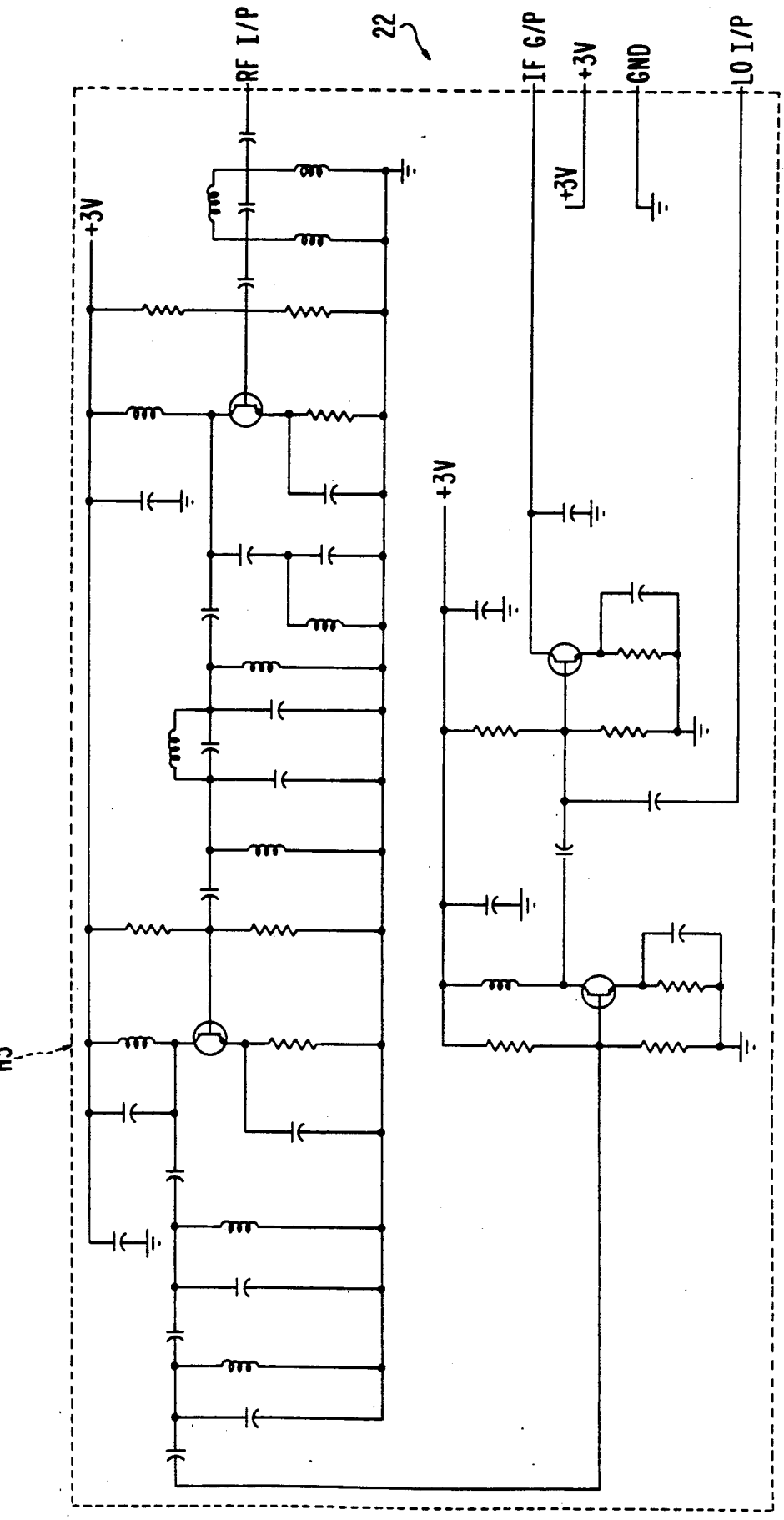
FIG. 9 is a circuit schematic of the amplifier and mixer 22 of FIG. 1.
Figure 10:
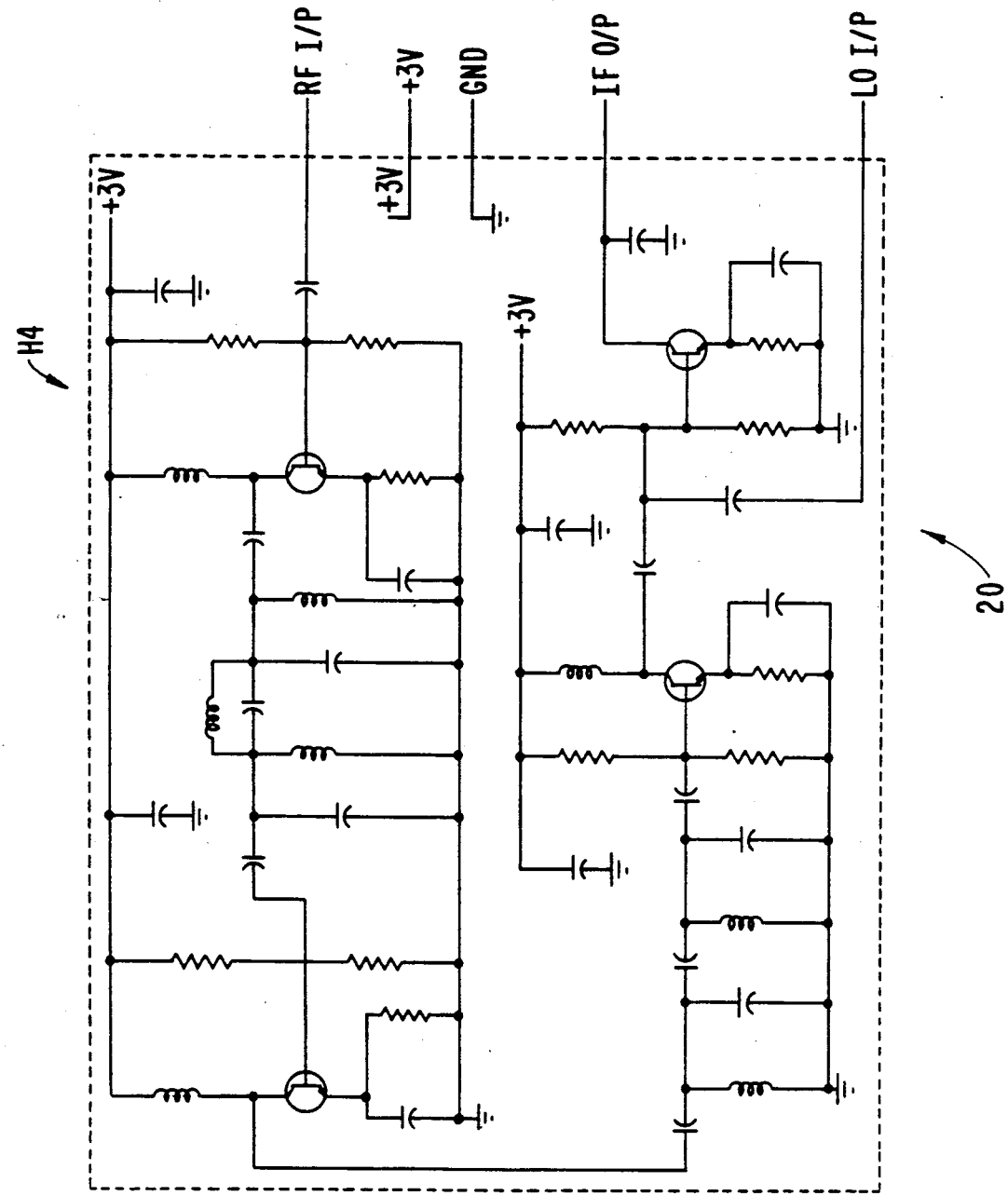
FIG. 10 is a schematic of the amplifier and mixer 20 of FIG. 1.
Figure 11A:
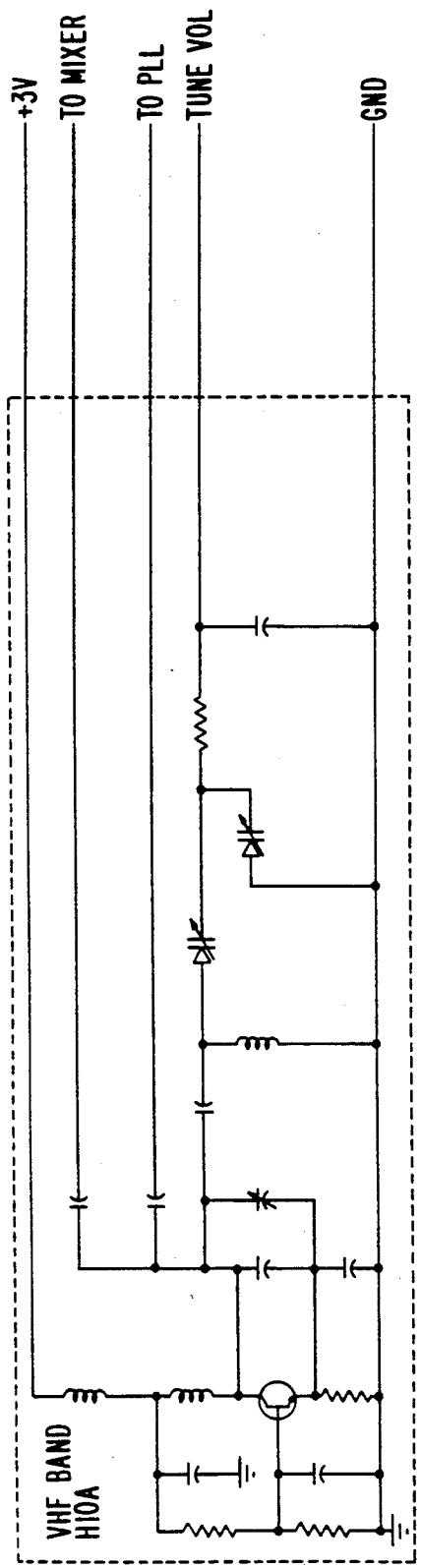
FIGS 11A-C are a circuit schematic of the voltage controlled oscillator 30 of FIG. 1.
Figure 11B:
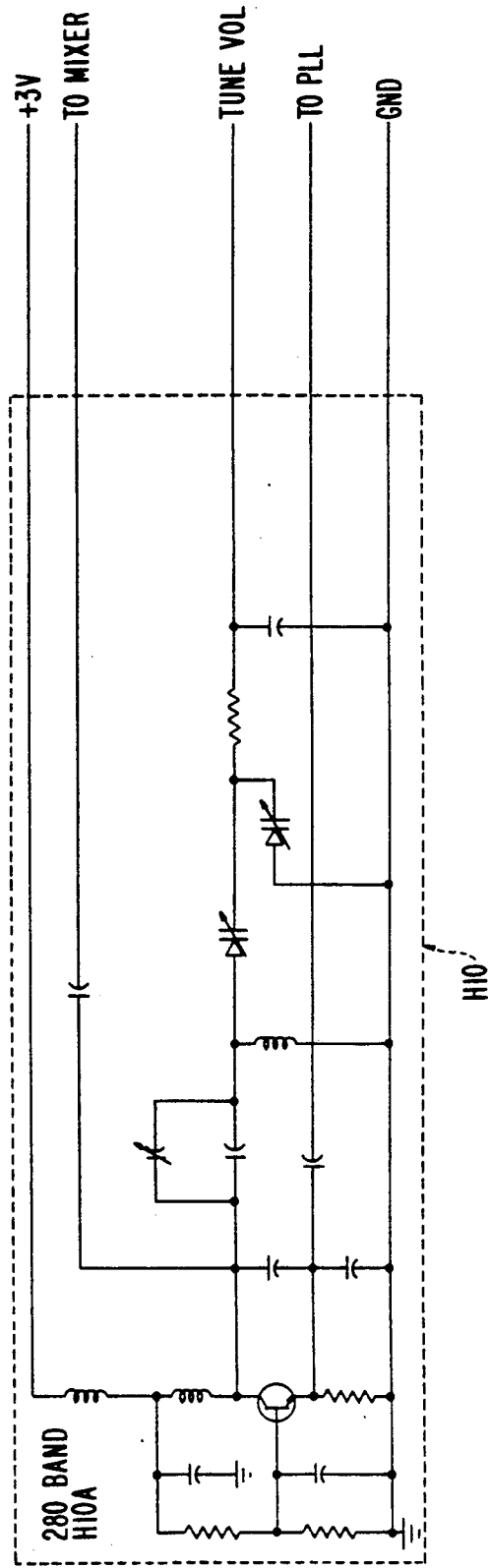
Figure 11C:
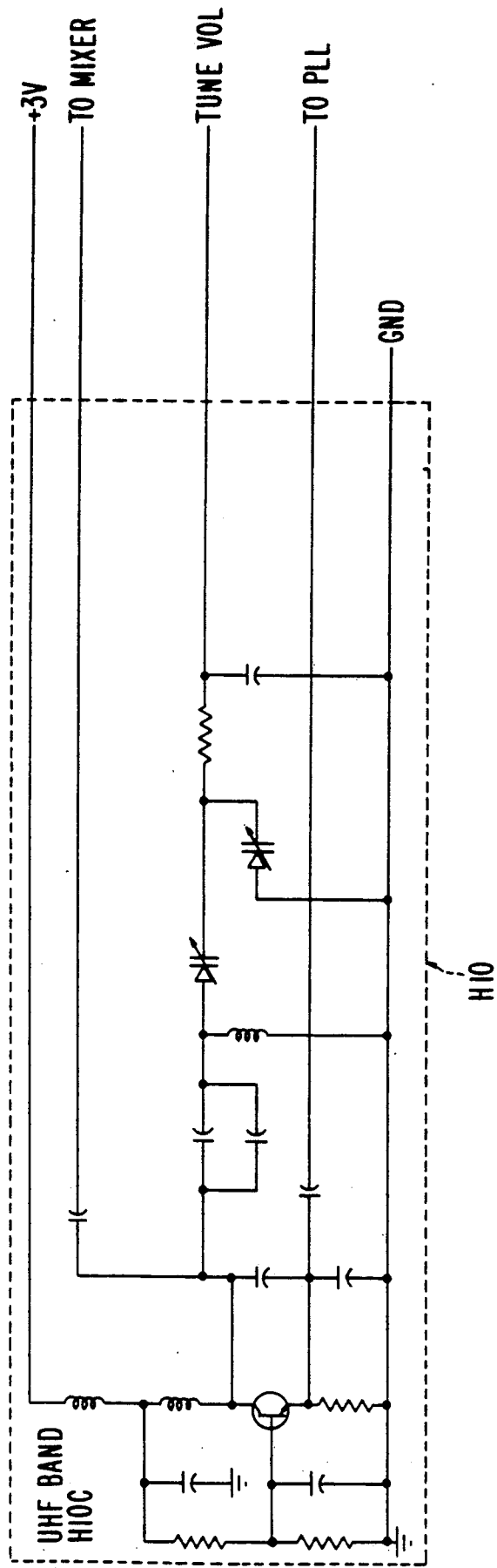
Figure 12:
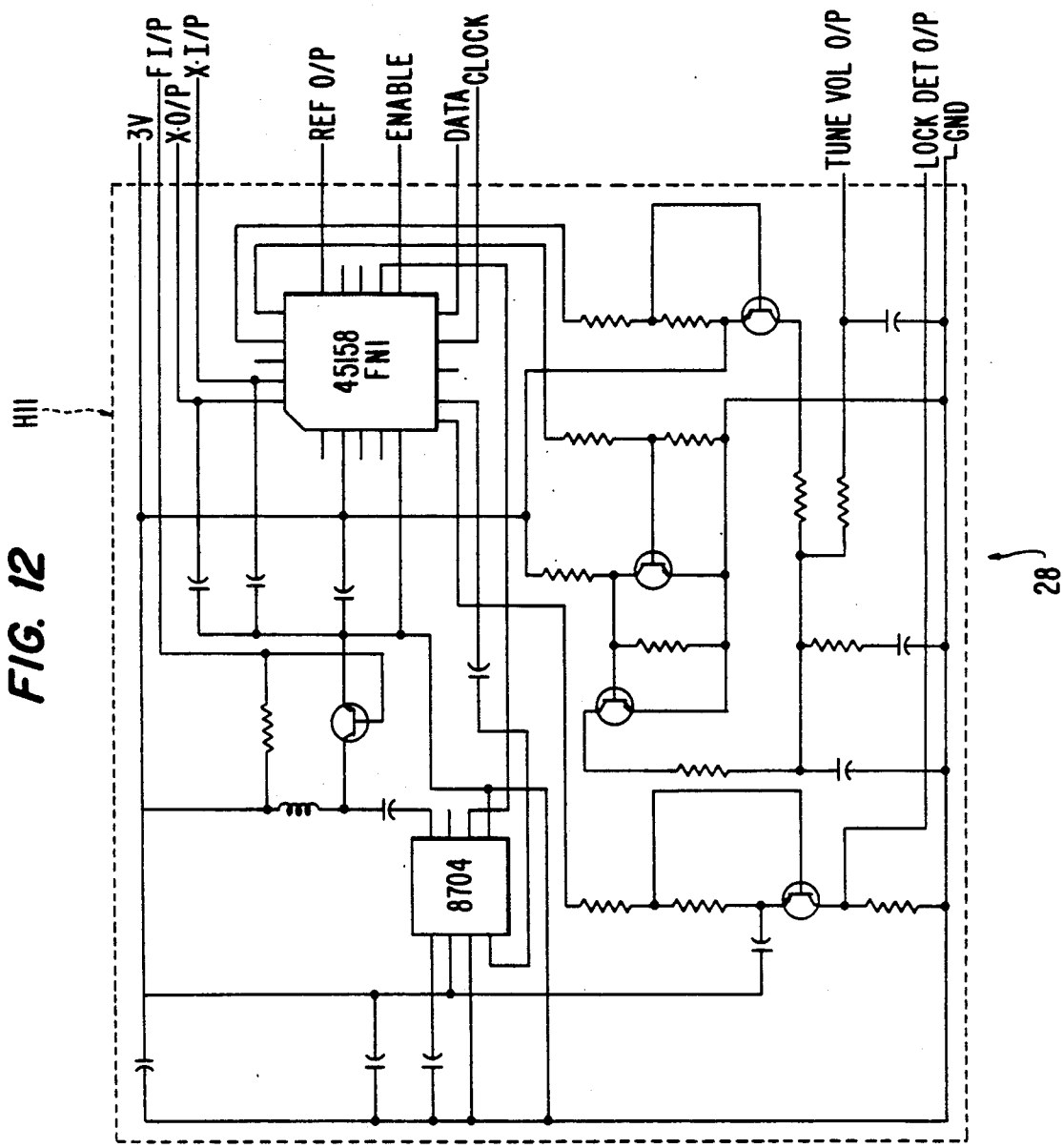
FIG. 12 is a circuit schematic of the phase lock loop 28 of FIG. 1.
Figure 13:
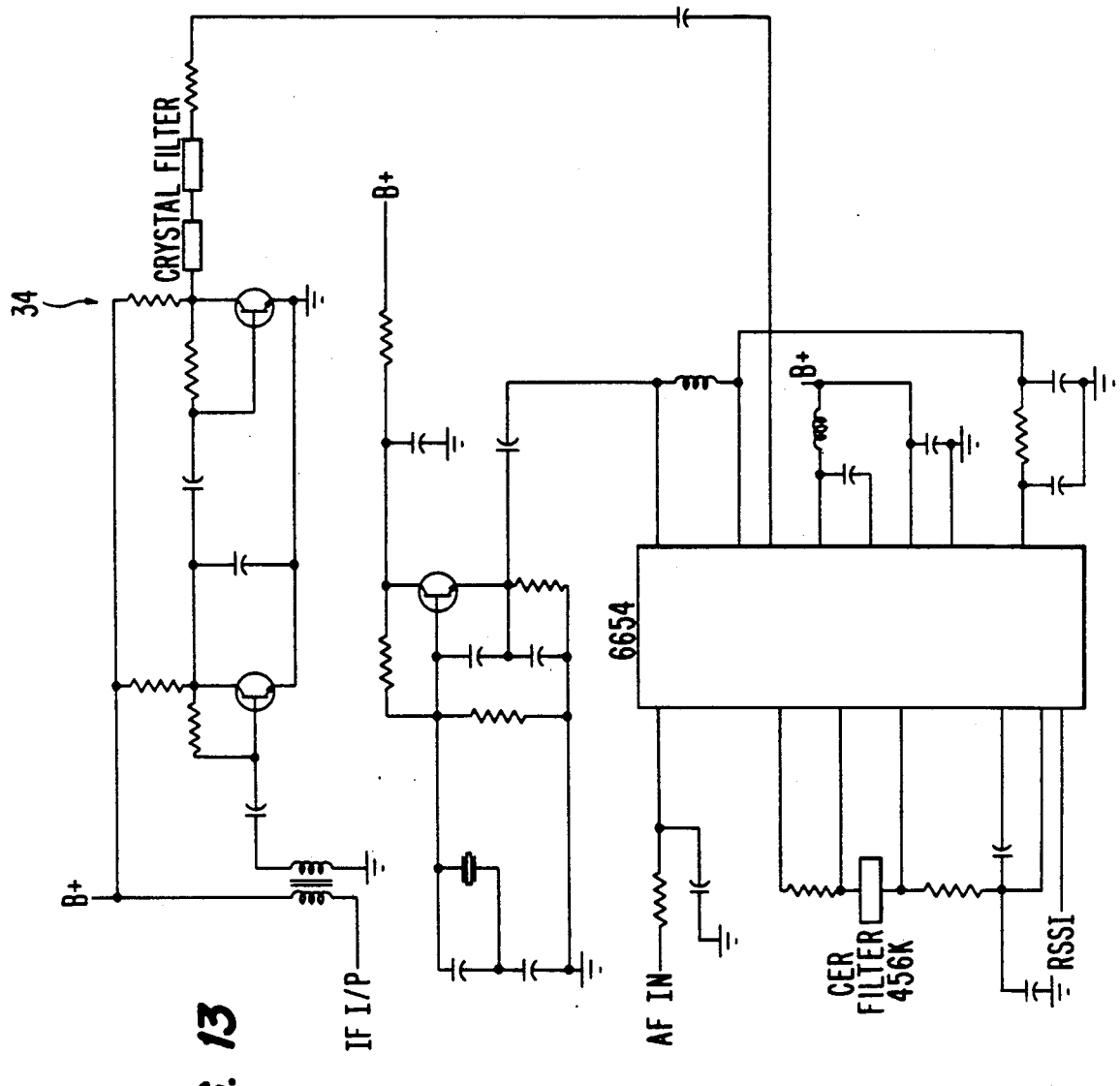
FIG. 13 is a circuit schematic of the IF processing circuit 34 of FIG. 1.
Figure 14A:
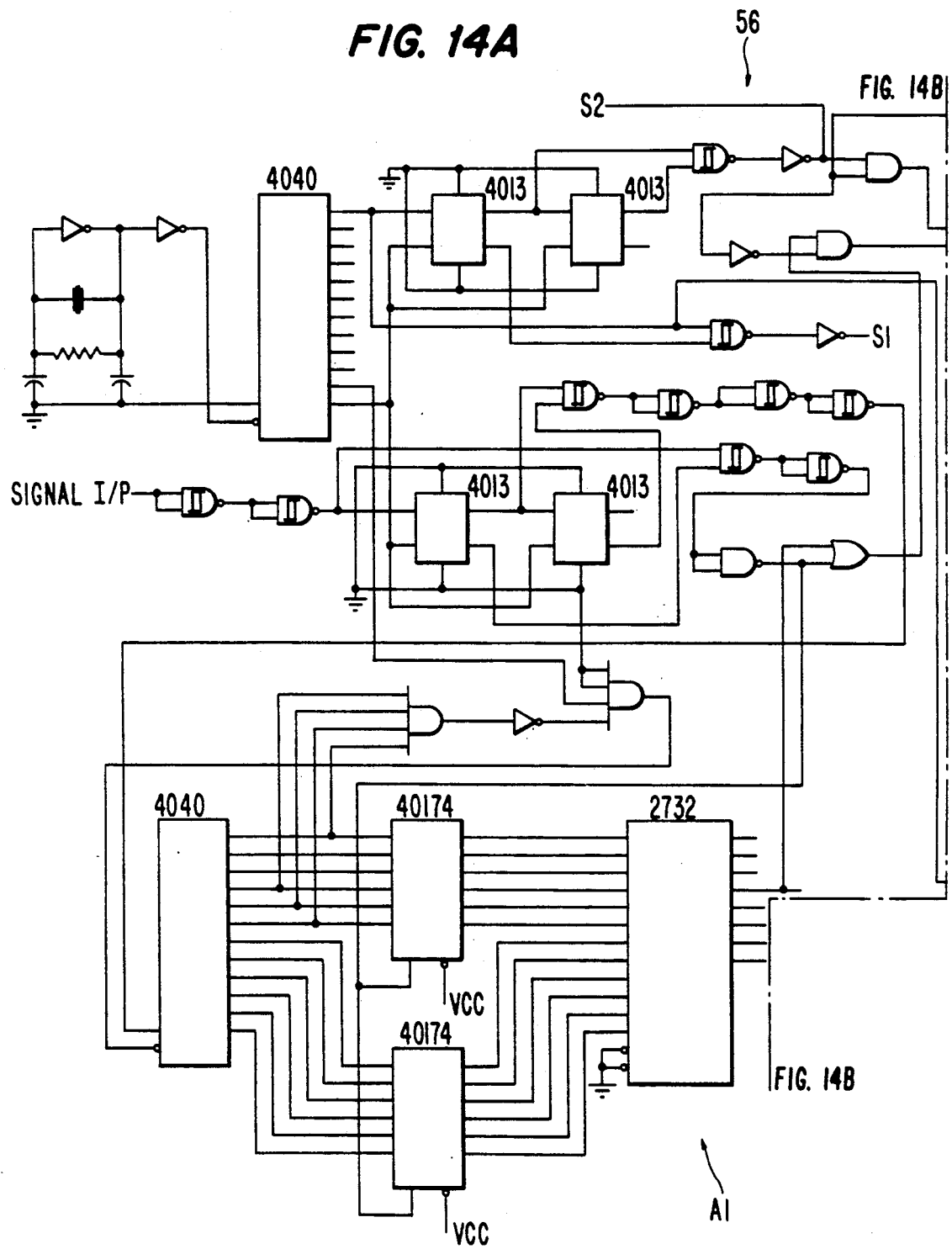
FIGS. 14A-B are a circuit schematic of the tone decoder 56 of FIG. 1.
Figure 14B:
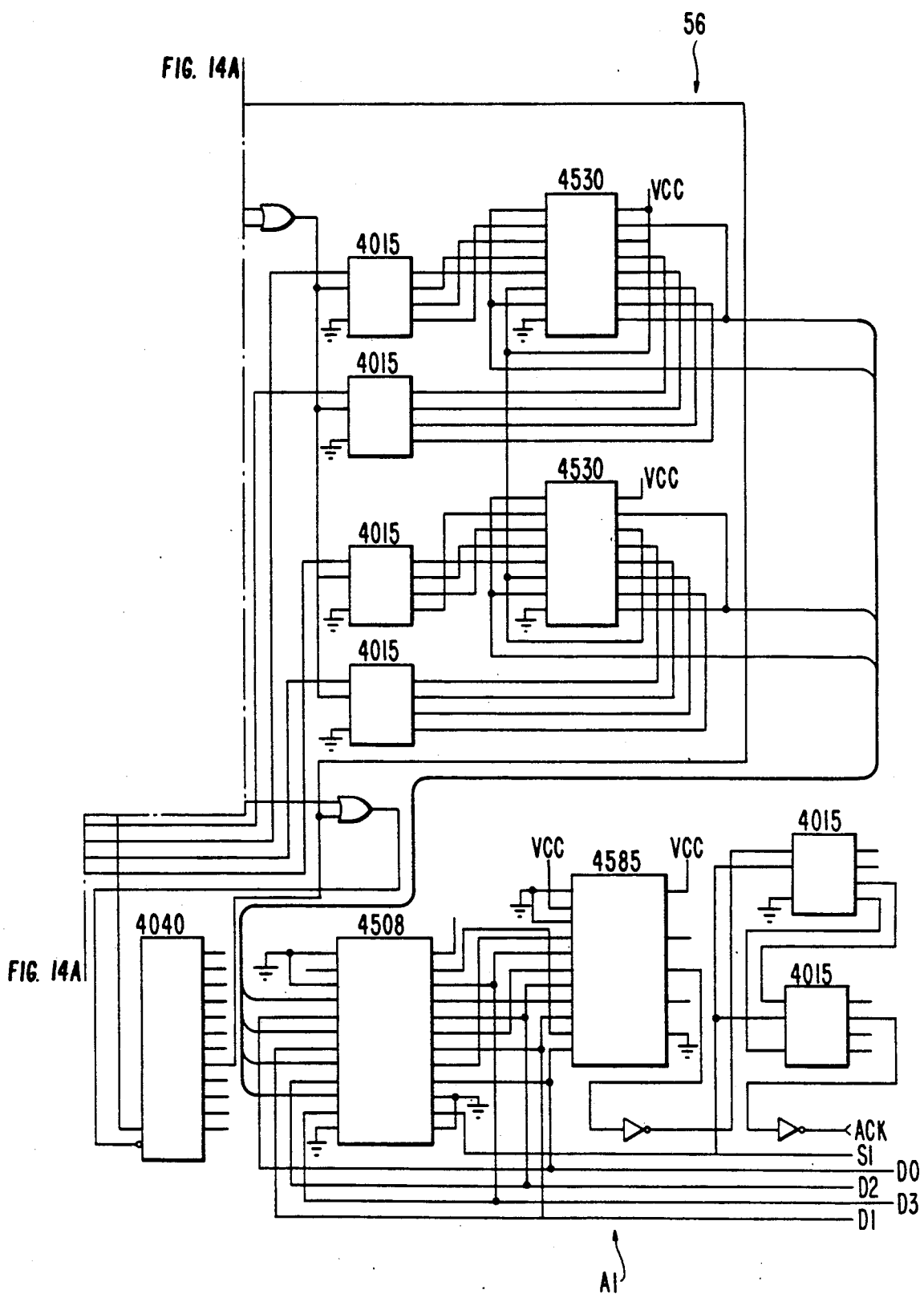
Figure 15A:
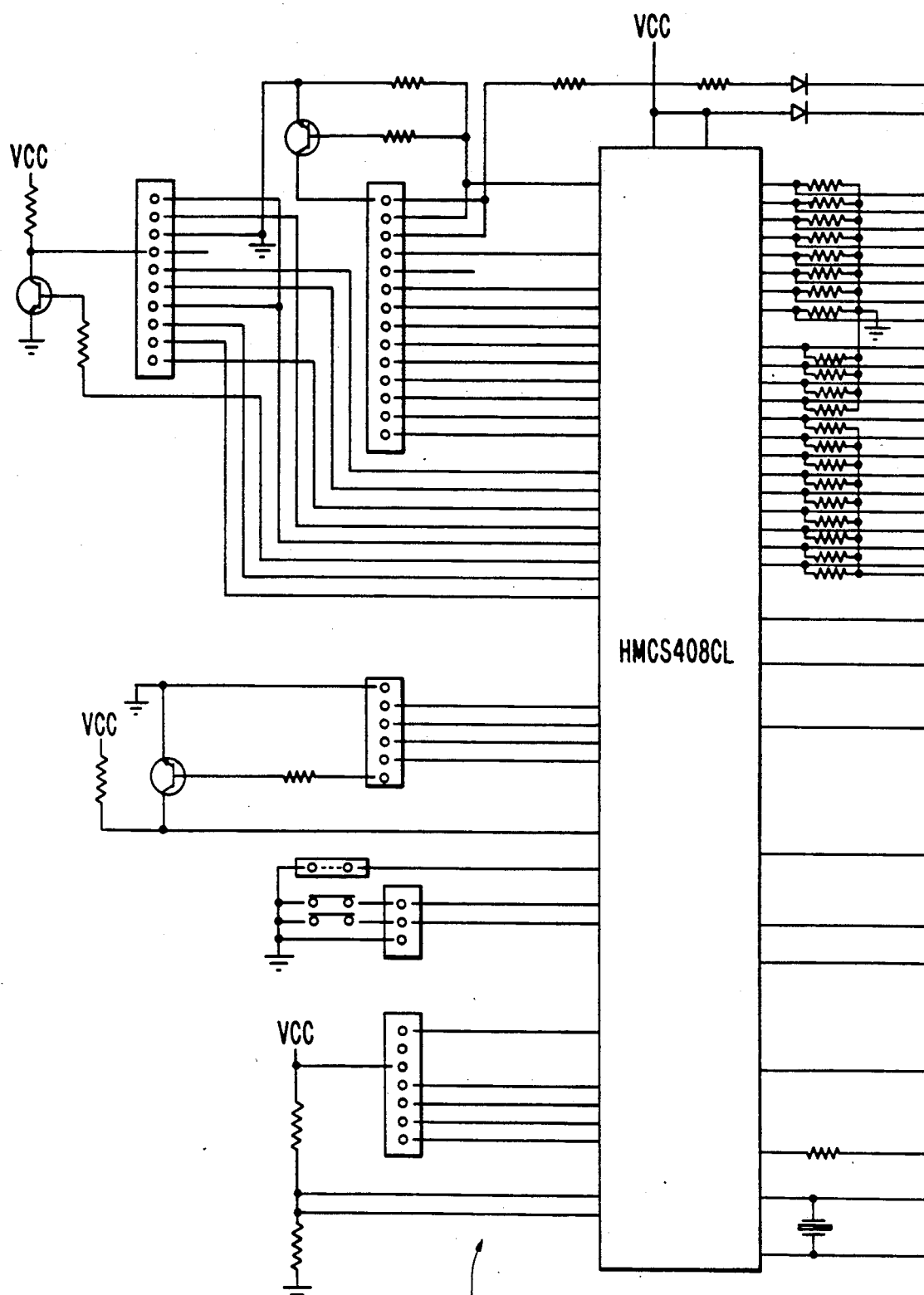
FIGS. 15A-B are a circuit schematic of the main CPU 24 of FIG. 1.
Figure 15B:
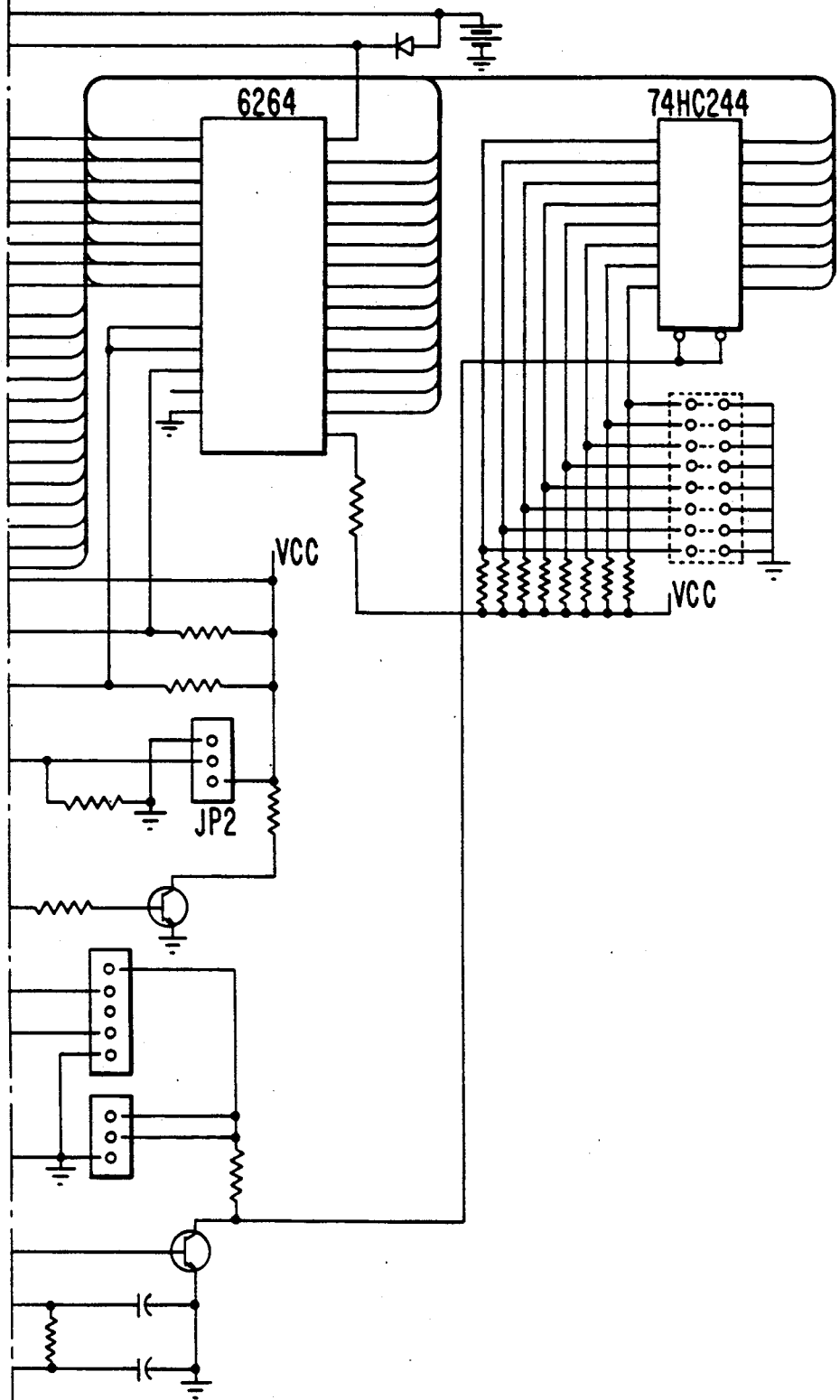
Figure 16:
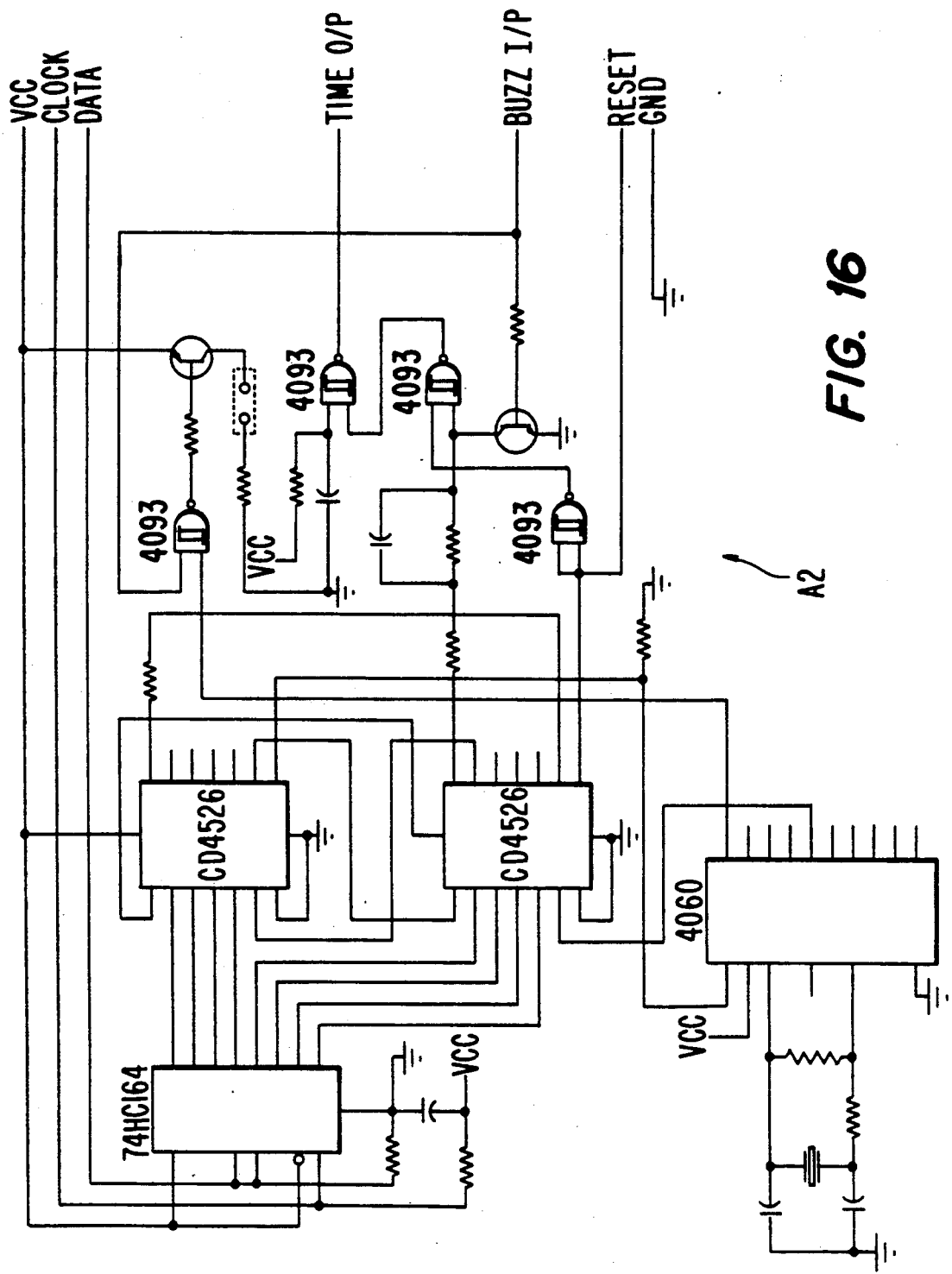
FIG. 16 is a circuit schematic of the ASIC circuit A2 of the antenna controller 44 of FIG. 1.
Figure 17:
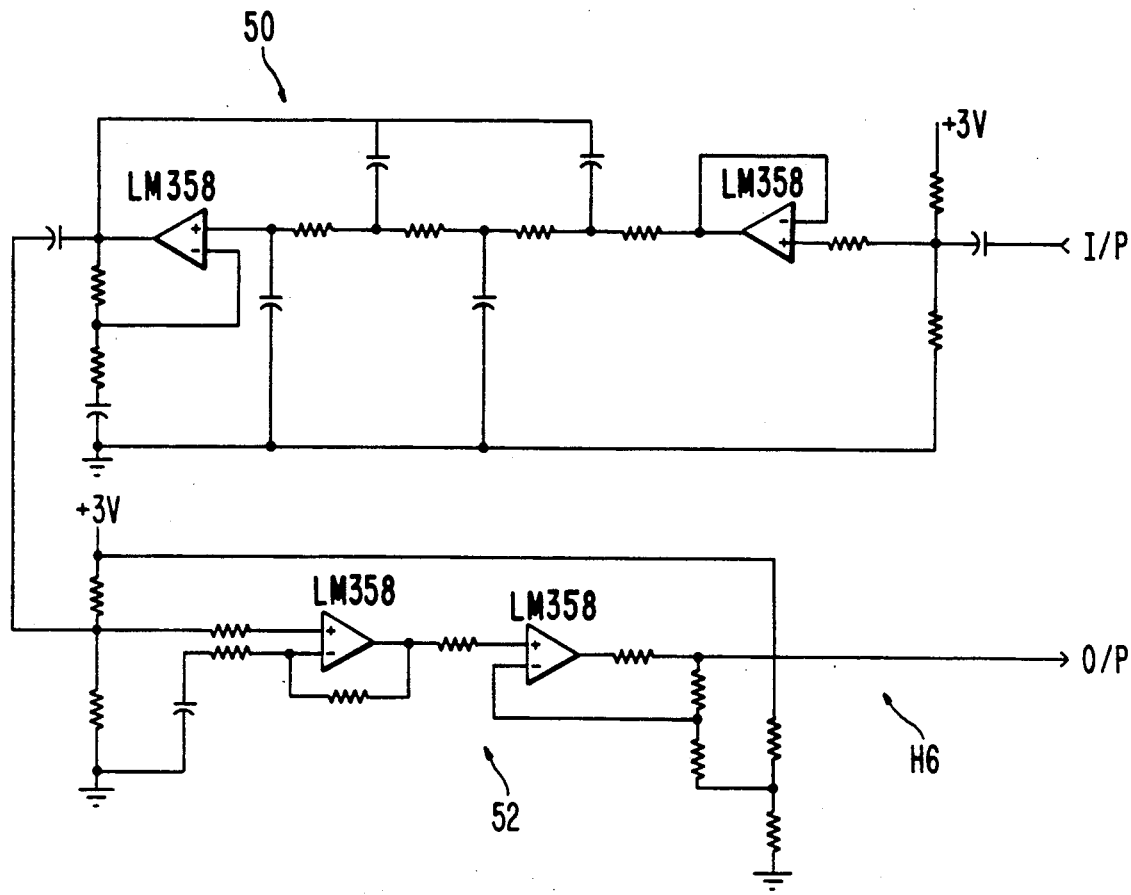
FIGS. 17 is a circuit schematic of the buffer amplifier 50 and low pass filter 52 of FIG. 1.
Figure 18:
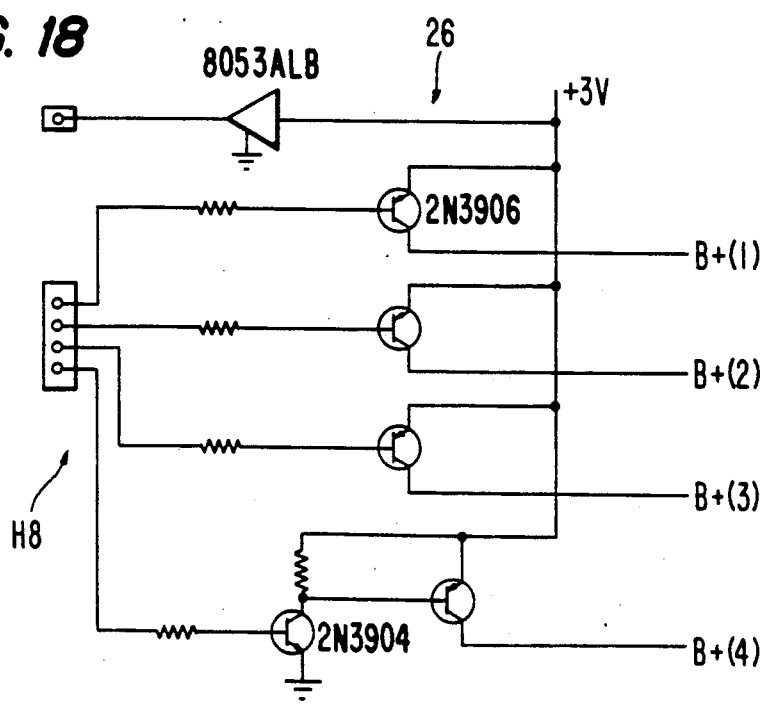
FIG. 18 is a circuit schematic of the power controller 26 of FIG. 1.
Figure 19A:
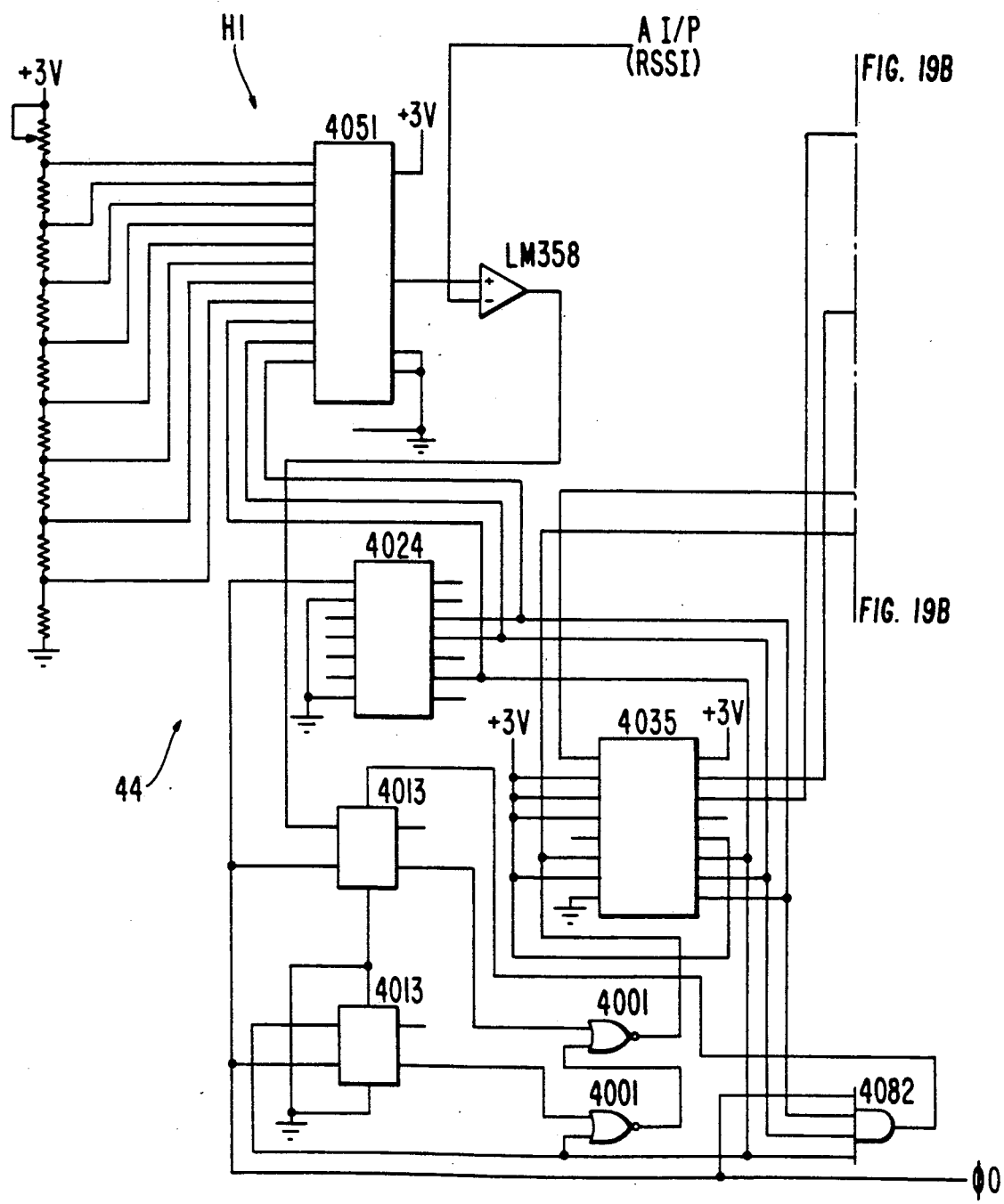
FIGS. 19A-B are a circuit schematic of the antenna controller 44 of FIG. 1 without the ASIC circuit of FIG. 16.
Figure 19B:
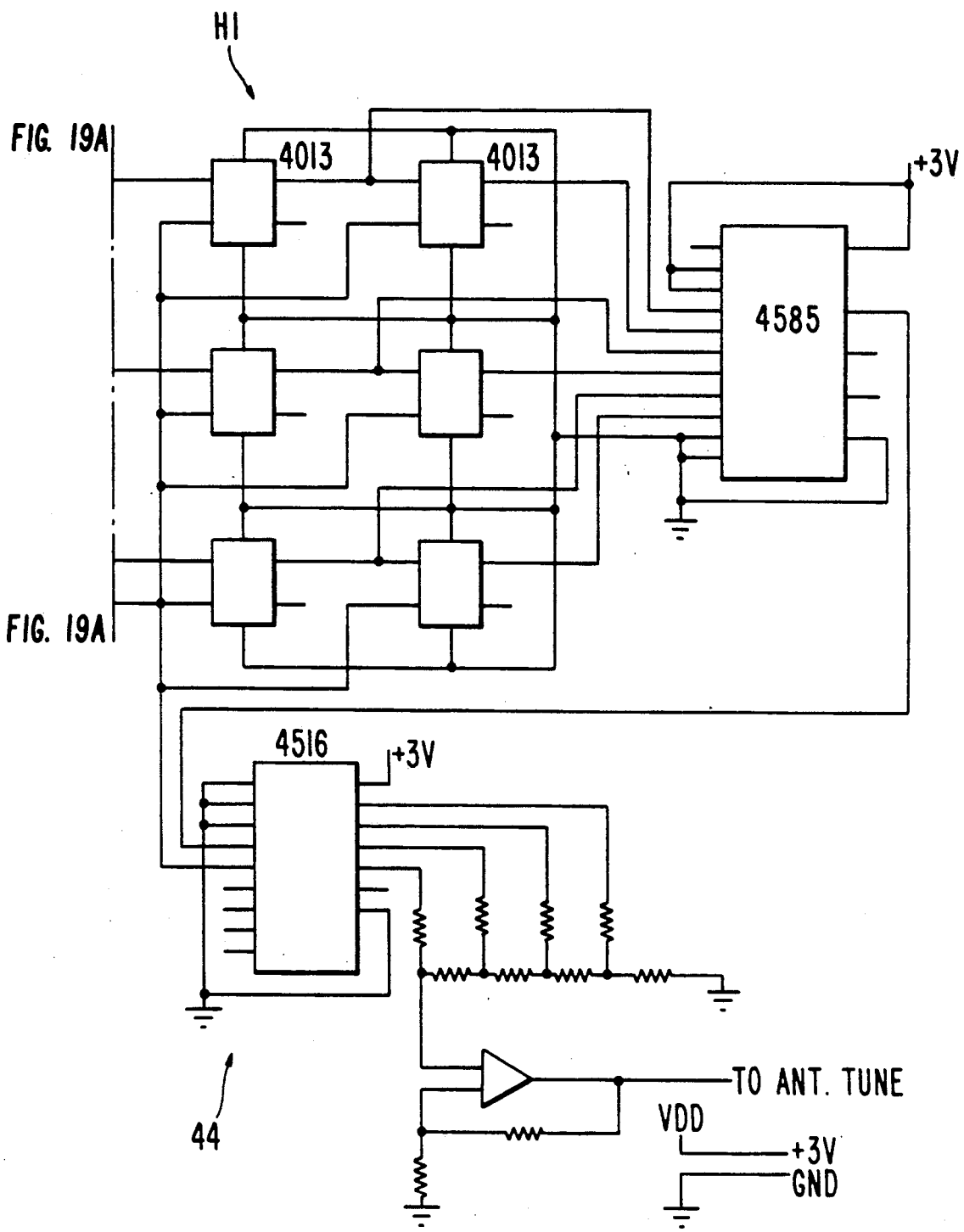
Figure 20:
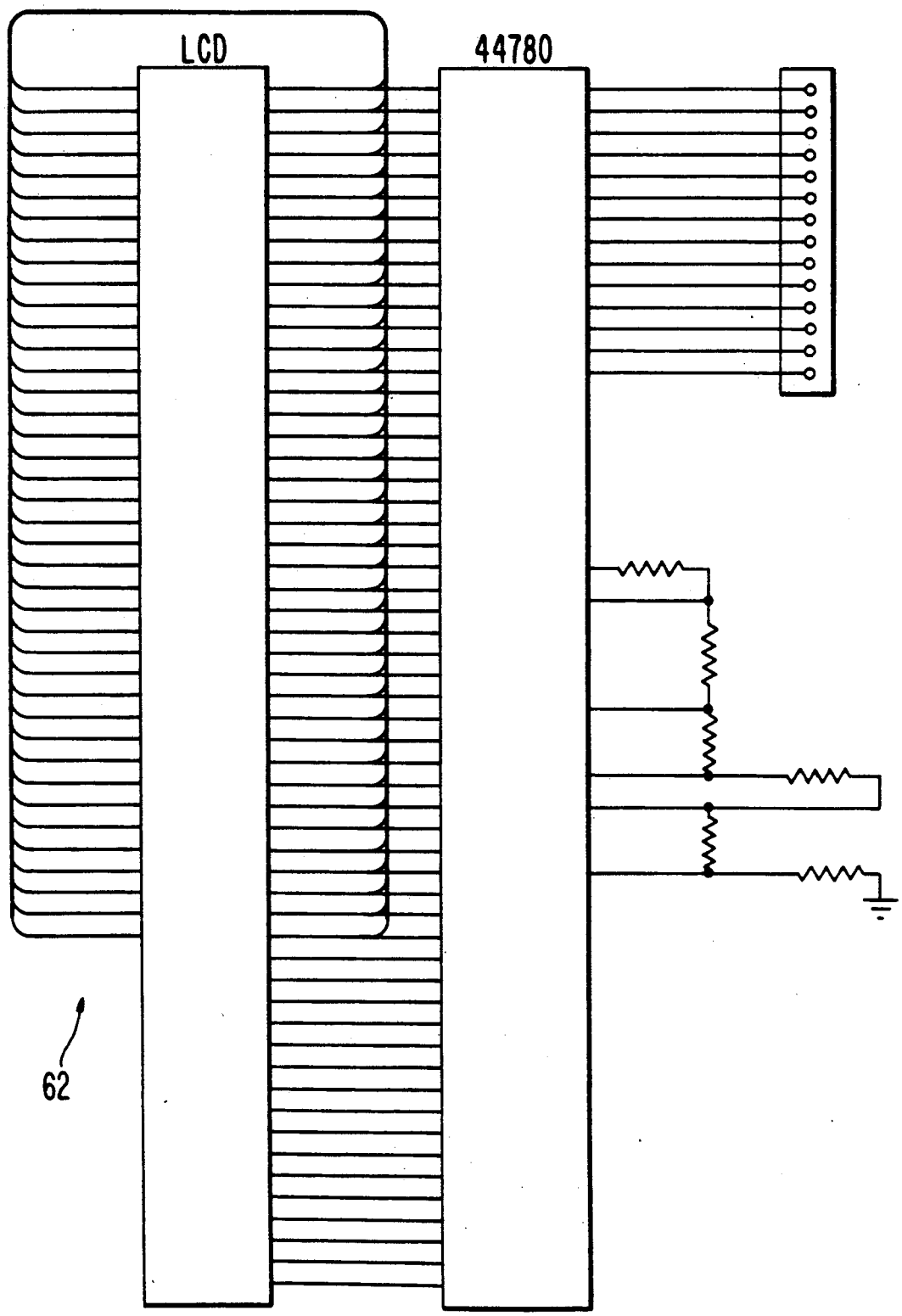
FIG. 20 is a circuit schematic of the LCD display driver 62' of FIG. 1.

FIG. 1 illustrates a block diagram of paging receiver 10 in accordance with the invention. Actual circuits for implementing the various blocks of the block diagram of FIG. 1 are set forth below in FIGS. 7-20. An internal antenna 12 functions to receive a total of 10,600 possible channels from the three discrete frequency bands referred to above in the description of the Background Art. Because of the large number of possible channels which may be received in the distinct three frequency bands, the antenna 12 has a broad band characteristic. In the paging receiver of the present invention, the antenna 12 is designed to be resonant as close as is reasonably possible in all of the three frequency bands which it is designed to receive. In other words, an optimum impedance match is desired. However, the effects of the environment in which the antenna 12 is disposed during operation (a paging receiver is typically clipped to the belt of a person) cause a variation in the degree of resonance as a consequence of variable inductance and capacitance caused by a person's body, etc. in the environment of the antenna. Thus, the gain of the antenna 12 is subject to substantial variation as a consequence of the person on which the pager is located and the physical environment in which the pager is located both of which can substantially degrade the gain of the received page applied to antenna circuit 14. The antenna circuit 14 is a tuner containing variable capacitance diodes to which is applied an ANTENNA TUNING SIGNAL to maximize the gain of the antenna 12 for the particular channel frequency that RF tuner 16 is tuned to receive. A circuit schematic of the antenna circuit is illustrated in FIG. 7. The antenna circuit 14 is tuned by the ANTENNA TUNING SIGNAL which functions to tune the antenna 12 to achieve maximum gain in a manner described below in detail. The RF tuner 16 is comprised of three separate radio frequency amplifiers and mixers 18, 20 and 22 which respectively receive UHF and 280 MHz VHF and VHF frequency bands. A circuit schematic of the UHF amplifier and mixer circuit 18 is illustrated in FIG. 8; a circuit schematic of the 280 VHF amplifier and mixer circuit 20 is illustrated in FIG. 10; and a circuit schematic of the VHF amplifier and mixer circuit 22 is illustrated in FIG. 9. Only one of the amplifiers and mixers 18, 20 and 22 is energized during reception of any of the channels which cuts down on power consumption. A main CPU 24 controls the activation of a power controller 26 which selectively activates one of the amplifier and mixer circuits 18, 20 and 22 depending upon in which of the UHF, 280 VHF and VHF frequency bands a page is to be received. The digital RECEIVER TUNING SIGNAL outputted by the main CPU 24 specifies one of the 10,600 possible channels to be received by the preferred embodiment which are stored in ROM 58 as discussed below. The RECEIVER TUNING SIGNAL is applied to phase lock loop 28 which frequency locks voltage controlled oscillator 30 on the particular channel specified by the RECEIVER TUNING SIGNAL. When a particular channel is to be received by the RF tuner 16, the main CPU 24 digitally commands the power controller 26 to activate a particular one of the amplifier and mixer circuits 18, 20 and 22 which is to receive the channel to be received. By deactivating the remaining two amplifier mixer circuits power is conserved over that which would be consumed if all three amplifiers and mixer circuits 18, 20 and 22 were simultaneously activated. A circuit schematic of the main CPU 24 is illustrated in FIG. 15A-B; a circuit schematic of the power controller circuit is illustrated in FIG. 18; a circuit schematic of the phase lock loop circuit 28 is illustrated in FIG. 12; and a circuit schematic of the voltage controlled oscillator 30 is illustrated in FIG. 11A-C. The voltage controlled oscillator 30 produces an output frequency which is mixed with the signal being received by one of the amplifier and mixers 18, 20 and 22 to produce a 21.4 MHz output signal. The 21.4 MHz output signal is filtered by a 21.4 MHz filter 32. The output of the 21.4 MHz filter 32 is applied to an IF processing signal circuit 34 to produce the IF signal of 450 kHz. The output signal from the mixer oscillator 36 is applied to an IF amplifier 38 which amplifies the IF signal to a level sufficient for discrimination by FM discriminator circuit 40. A RSSI circuit (received signal strength indicator) 42 produces an output signal having a magnitude directly proportional to the level of the output signal from the discriminator 40. A circuit schematic of the IF processing circuit 34 is illustrated in FIG. 13. The RSSI signal outputted by the RSSI circuit 42 is applied to an antenna controller circuit 44. The antenna control circuit 44 contains an analog-to-digital converter 46 which converts the analog RSSI signal into digital format suitable for processing by a dedicated ASIC microprocessor. The antenna controller 44 contains an ASIC microprocessor based control circuit which executes a computer program contained in a ROM in the ASIC circuit. The ASIC circuit functions to produce a wobble signal which is outputted as a variable digital value which is applied to digital-to-analog converter 46 to produce the ANTENNA TUNING SIGNAL having a variable analog value which causes the antenna circuit 14 to be tuned variably through a frequency band for the purpose of continually locking on the point of maximum gain as a channel is being received. The variation in signal amplitude caused by the wobbling of the tuning frequency of the antenna circuit 14 is detected by the RSSI circuit 42 so that the antenna controller circuit 44 continually outputs an ANTENNA TUNING SIGNAL which tunes the antenna circuit 14 to achieve maximum gain for the antenna 12. The ANTENNA TUNING SIGNAL compensates for environmental factors which change the gain of the antenna 12 during reception such as variable inductance and capacitance caused by a person's body. A circuit schematic of the antenna controller 44 is illustrated in FIG. 16. The discriminator circuit 40 outputs either no signal (level F) or one of fifteen discrete sinusoidal frequencies each of which encodes a different signal value received from either an analog or digital FM paging receiver transmitter as described below. A buffer amplifier 50 amplifies the sinusoidal output signal from the discriminator circuit 40 to a level to create a square wave having a period equal to the period of the sinusoidal signal outputted by the discriminator 40. The square wave outputted by the buffer amplifier 50 is filtered by low pass filter 52 to attenuate frequencies below 400 hertz. A circuit schematic of the buffer amplifier and low pass filter is illustrated in FIG. 17. The output of the low pass filter 52 is applied to high pass filter 54 which attenuates frequencies above 3000 hertz. A tone decoder circuit 56 converts the discrete tones contained within the 400 to 3000 hertz pass band defined by the low pass filter 52 and high pass filter 54 as described below in FIG. 3 to produce an output level signal indicative of 16 possible levels. The main CPU 24 processes successive coded transmissions of data by combining them into a two-digit decimal number and decoding the two-digit number into alphanumeric characters. A table correlating the decimal values with their corresponding characters is set forth below. The control program for the main CPU 24 is stored in ROM 58. The ROM 58 also stores the possible channels which may be received, which in the preferred embodiment are 10,600, a command structure table used for decoding each of the commands discussed below, as well as the display control for the LCD display 64,. Variable data is stored in RAM 60. The RAM 60 has separate memory sections for storing pages including specific memory sections which are addressable by command, the channels which are programmed to be received by the channel programming command including any destination code for restricting the place of reception of pages or a group of paging receivers to receive a page in a geographical area in a channel memory and the paging receiver identification. In the preferred embodiment there are 15 separate memory sections which store pages with sections 11-14 being addressable by command and sections 1-10 and 15 not being addressable by command. The main CPU 24 controls a liquid crystal display driver circuit 62'. A circuit schematic of the liquid crystal display driver is illustrated in FIG. 20. The liquid crystal driver circuit 62' drives a liquid crystal display 64 described below in FIG. 3. An external data port 67 is used to relay the output signal from the discriminator 52 to another data processing or storage device when the main CPU 24 executes an external data command discussed below. A port 68 is coupled to the main CPU 24 for driving an external printer. A port 69 is provided for establishing necessary communications between the main CPU 24 and an external printer. A display switch 70 is used for activating the display 64. A light switch 71 is used for activating back lighting of the display 64. The switches 70 and 71 may also be used for inputting data when suitable displays are made on the display 64 by the control program of the main CPU 24. Port 72 is connected to the paging receiver battery (not illustrated) for providing power. Port 73 is provided for activating an audio alarm contained in the paging receiver and port 74 permits connection to an external antenna which may be used when the paging receiver is connected to an external device such as a printer.

A commercial embodiment of the paging-receiver 10 illustrated in FIG. 1 has 10,600 discrete channels stored in ROM 58 from the three discrete bands which may be received by the amplifier and mixers 18, 20 and 22 as described above. The main CPU 24 is responsive to a channel programming command, described below with reference to the commands which the main CPU 24 executes, to dynamically tune the RF tuner 16 to discrete channels. Each channel programming command is decoded by the main CPU 24 to extract a channel, from the 10,600 possible channels stored in ROM 58, to be stored in a channel memory section 62 of the random access memory 60 described below with reference to FIG. 2.

II. Channel Memory

Figure 2:
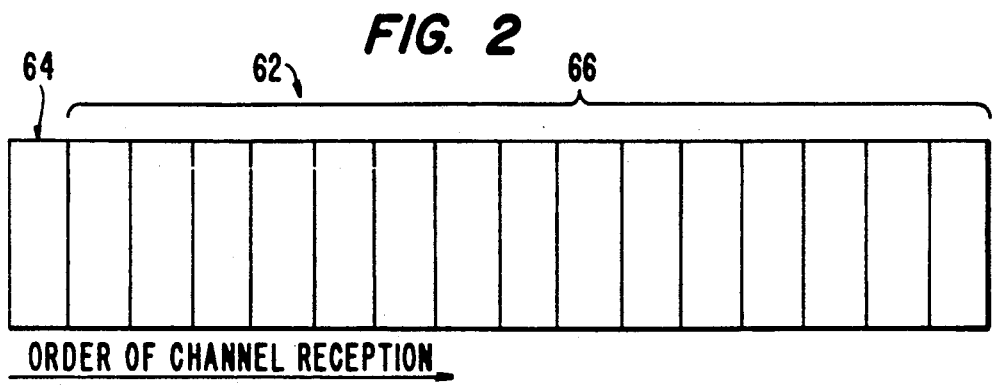
FIG. 2 is a diagram of the channel memory used for storing channels to be received.

FIG. 2 illustrates the channel memory 62 which is comprised of an operating channel section 64 storing a single channel and an area channel section 66 storing up to 15 discrete channels to be scanned sequentially by the RF tuner 16 under the control of the operating program of the main CPU 24. Illustrated below the operating channel section 64 and the area channel section 66 is an arrow indicating the order of channel reception by the RF tuner 16 when channels are being scanned to detect a carrier. The control program of the main CPU 24 changes the channel stored in the operation channel section 64 to automatically have the last received channel received by the RF tuner 16 stored therein. The channel stored in the operation channel section 64 is one of the channels that the channel memory 62 of the RAM 60 has been programmed to receive by the channel programming command. It should be understood that while 15 possible discrete channels may be stored in the area channel section 66, it is only required that the area channel section 66 be programmed with only one channel which is typically the case when the paging receiver is to operated locally to receive only a single channel. In that case, the operating channel section 64 automatically stores the only channel that the RF receiver 16 will receive upon activation by the main CPU 24 and reception of the carrier signal. Furthermore, it should be understood that any number of channels may be utilized in practicing the invention. Each time the control program of the main CPU 24 outputs a channel from the channel memory 62 to be received by the RF tuner 16, the main CPU 24 applies the RECEIVER TUNING SIGNAL in the form of a digital signal to the phase lock loop 28 which activates the voltage controlled oscillator 30 to produce a 21.4 MHz signal from the single activated amplifier and mixer circuit 18, 20 and 22. The control program of the main CPU 24 analyzes the signal which is outputted from the channel memory 62 and applies a control signal to the power controller 26 which selectively applies power from the power circuit 66 to only the particular one of the RF amplifier and mixers 18, 20 and 22 which is to receive the channel specified by the RECEIVER TUNING SIGNAL thereby saving power consumption of the battery.

The individual channels of the area channel section are programmed at the time that the paging receiver identification code is sent to the paging receiver identification code memory described below, when the pager is issued to a customer, and further are also reprogrammed when the customer desires to "roam" to another service area such as during business travel in which it may be desired to receive pages on the same channels that the paging receiver is currently programmed to receive in which case a destination code will be added by the channel programming command or to receive different channels in which case different channels will be programmed. The programming of channels may also be accomplished dynamically during local paging to switch the paging receiver to channels which are not as busy as a channel that the paging receiver is currently programmed to receive. As is apparent from FIG. 2, during channel scanning for the purpose of finding a channel on which at least one carrier is present, channels to be received are selectively outputted from the operating channel section 64 first and then from the successive section 66 of the area channel section. Each of these channels causes the phase lock loop 28 to lock the voltage controlled oscillator 30 to a frequency necessary to produce the 21.4 megahertz signal from the activated RF amplifier and mixer circuits 18, 20 and 22 which is to receive the particular channel. The control program causes the channel which is stored in the operating channel section 64 to be cyclically received for a predetermined time interval, such as but not limited to 15 minutes, by activating the RF tuner 16 once every 900 milliseconds, or other appropriate channel, to sample the channel for the presence of a carrier signal and if carrier signal is present to compare the paging receiver identification code discussed below transmitted with the page in the order of increasing significance of the digits until a mismatch between the transmitted paging receiver identification code digits and the digits of a paging receiver identification code stored in the random access memory 60 is detected at which time the RF tuner 16 is shut off to conserve power.

III. Universal Reception of Pages From Either Analog or Digital Transmitters

Figure 3:
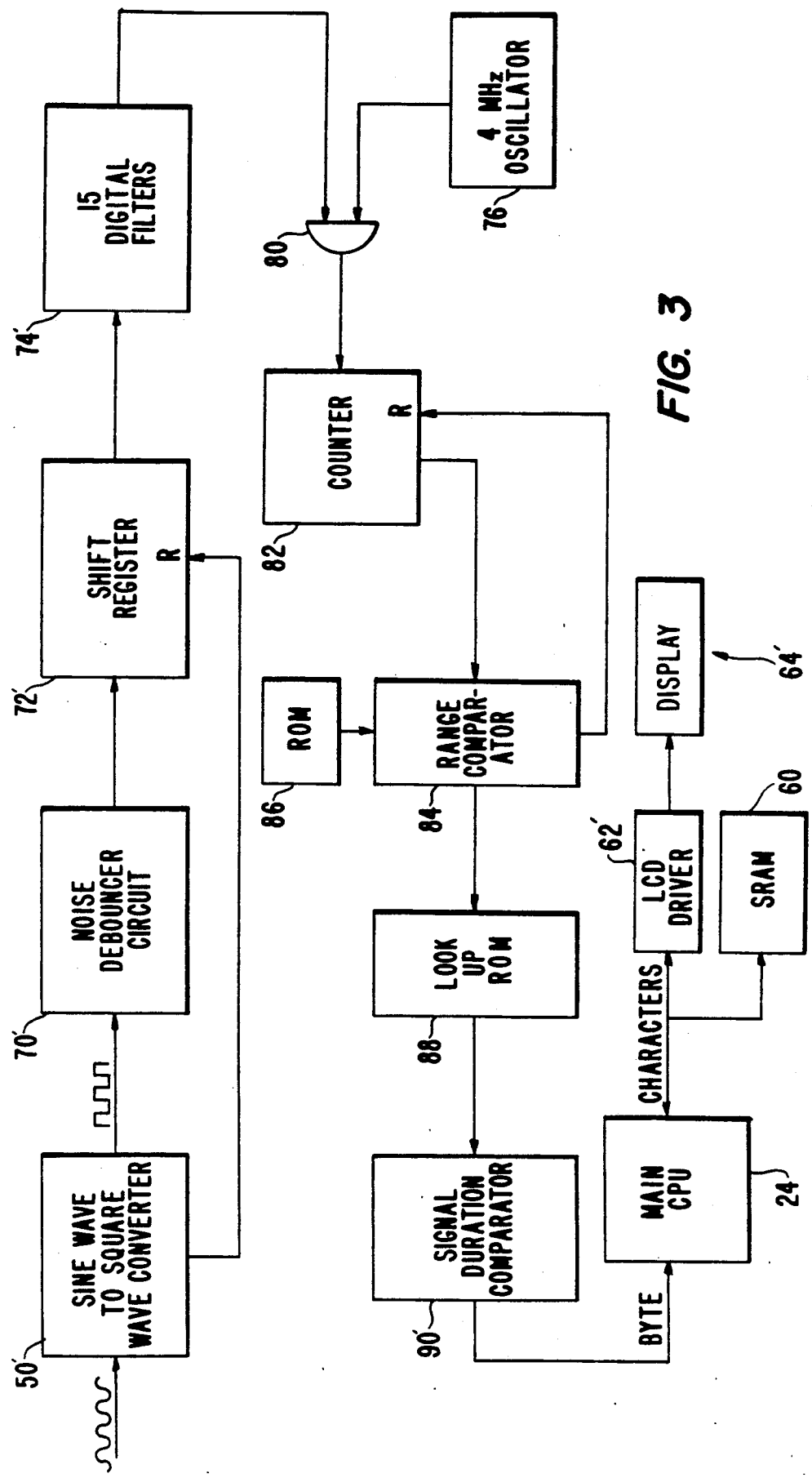
FIG. 3 is a functional block diagram of the operation of a paging receiver in accordance with the present invention in processing signals from analog and digital transmitters.

FIG. 3 illustrates a detailed block diagram of the buffer amplifier 50, low pass filter 52, high pass filter 54 and tone decoder 56 of the present invention for universally processing signals transmitted from either analog or digital FM paging transmitters. The preferred form of the signal protocol of the present invention utilizes the following tones to encode 16 discrete signal levels as stated in a hexadecimal numbering system as follows: 600 Hz.=0; 741 Hz.=1; 882; Hz.=2; 1023 Hz.=3; 1164 Hz.=4; 1305 Hz.=5; 1446 Hz.=6; 1587 Hz.=7; 1728 Hz.=8; 1869 Hz.=9; 2151 Hz.=A; 2435 Hz.=B; 2010 Hz.=C; 2295 Hz.=D; 4059 Hz.=E; and no tone (absence of modulated carrier signal)=F. Any existing analog FM paging transmitter can be used to output a carrier wave having a frequency which is frequency modulated with the above-described tones. Similarly, any existing digital FM paging transmitter can be used to output a square wave signal having a period modulated with the above-described frequencies encoded thereon. The output from the frequency discriminator 40 is applied to a sine wave to square wave converter 50' which amplifies the sinusoidal input signal to convert it to a square wave having a period equal to a period of the sinusoidal input signal. The output of the sine wave to square wave converter is applied to a noise debouncer circuit 70' which removes jitter from the input square wave signal to provide precise period information on its output. The output from the noise debouncer circuit 70' is applied to a shift register 72, having a number of stages requiring a predetermined time duration of the input square wave outputted by the noise debouncer circuit 70' to be applied to produce an output. The shift register 72' is reset each time the signal level from the sine wave to square wave converter 50' is zero or changes frequency. The function of the shift register 72' is to eliminate transient signals which are not valid signal levels. The number of stages is chosen to be sufficient to produce an output when an actual tone used for encoding valid information is received while blocking transmission of invalid transient shorter duration tones. Output signals having a duration less than the time required to fill up the shift register 72′ are not applied to a group of 15 digital filters 74. Each of the digital filters has a pass band centered around a different one of the tones set forth above. When a square wave having a frequency falling within the pass band of any one of the fifteen digital filters is applied to the fifteen digital filters 74′, an output square wave signal is produced as inputted to the fifteen digital filter from the shift register 72′. A 4 MHz. oscillator 76 applies a 4 MHz. internal reference signal to an AND gate 80 to which the output of the fifteen digital filters 74′ is also applied. The high frequency of the oscillator 76 permits a large number of samples to be taken for each high level state of the output of the fifteen digital filters 74′. By providing the high level sampling frequency, it is possible to precisely determine the frequency of the fifteen tones used for encoding signal levels with a high degree of accuracy over a single cycle. The ability to detect accurately the frequency over a single cycle provides an extremely high throughput of information when a single cycle is used to encode sixteen possible data levels. The sampled output from the fifteen digital filters 74′ is passed by AND gate 80 to a counter 82 which counts the number of samples of the output of the digital filters 74′ which have a high state during a fixed time period of sampling by AND gate 80. The time interval during which the counter 82 counts the number of high level states passed by the AND gate 80 is not critical but should be chosen to be long enough to permit a high number of possible samples to be taken from a single cycle of the lowest frequency of the 15 tones identified above to permit a high degree of accuracy in the detection of the encoded frequencies transmitted with each page to encode character information. The output of the counter 82 is connected to a range comparator 84 which has an associated ROM 86. The ROM 86 has fifteen discrete address ranges stored therein with each address range being associated with a single one of the 15 tones. Each of the addresses within each range is addressed by a count applied from the counter 82. The range comparator 84 compares the output from counter 82 with addresses of the fifteen discrete ranges contained in the ROM 86 and passes the count from counter 82 to the look-up ROM 88 if a match occurs between the count outputted by the counter 82 and an address of one of the fifteen ranges stored in the ROM 86. If a match does not occur, the count from counter 82 is not passed to the look-up ROM 88. The range comparator 84 resets the counter 82 either upon the elapsing of the predetermined time interval during which the count from the counter 82 has been outputted to the look-up ROM 86 or when there is no match from between the count from the counter 82 and an address contained in one of the ranges stored in the ROM 86. The look-up ROM 88 outputs one of sixteen different numerical values which are representative of the sixteen possible signal values which may be encoded with each hexadecimal digit transmitted by either an analog or digital paging transmitter. THe output of the look-up ROM 88 is applied to a signal duration comparator 90′ which outputs one of the 16 numerical values (0-15) stored in the look-up ROM 88 to the main CPU 24 when the output of the look-up ROM is present for a duration for a time interval such as 10 milliseconds or longer. The purpose of the signal duration comparator 90′ is to remove transient conditions which are not indicative of the true transmission of a hexadecimal level by an analog or digital transmitter.

The output numerical values from a signal duration comparator 90′ are combined by the main CPU 24 in accordance with its operating program to produce a two-digit decimal number which is decoded to characters in accordance with the following conversion table when characters are transmitted to a paging receiver in accordance with alphanumeric commands A4 and A6 discussed below. The output of sequential numerical values is processed by the main CPU 24 in accordance with its operating program to produce numerical characters in accordance with numeric A3 and A5 commands discussed below.

| CONVERSION TABLE | |
|---|---|
| Two Digit Address | Character |
| 01 | ! |
| 02 | " |
| 03 | # |
| 04 | $ |
| 05 | % |
| 06 | & |
| 07 | ' |
| 08 | ( |
| 09 | ) |
| 10 | * |
| 11 | + |
| 12 | , |
| 13 | — |
| 14 | . |
| 15 | / |
| 16 | 0 |
| 17 | 1 |
| 18 | 2 |
| 19 | 3 |
| 20 | 4 |
| 21 | 5 |
| 22 | 6 |
| 23 | 7 |
| 24 | 8 |
| 25 | 9 |
| 26 | : |
| 27 | ; |
| 28 | < |
| 29 | = |
| 30 | > |
| 31 | ? |
| 32 | O |
| 33 | A |
| 34 | B |
| 35 | C |
| 36 | D |
| 37 | E |
| 38 | F |
| 39 | G |
| 40 | H |
| 41 | I |
| 42 | J |
| 43 | K |
| 44 | L |
| 45 | M |
| 46 | N |
| 47 | O |
| 48 | P |
| 49 | Q |
| 50 | R |
| 51 | S |
| 52 | T |
| 53 | U |
| 54 | V |
| 55 | W |
| 56 | X |
| 57 | Y |
| 58 | Z |

-continued
CONVERSION TABLE

| Two Digit Address | Character |
|---|---|
| 59 | [ |
| 60 | \ |
| 61 | ] |
| 62 | ^ |
| 63 | ≈ |
| 64 | |
| 65 | a |
| 66 | b |
| 67 | c |
| 68 | d |
| 69 | e |
| 70 | f |
| 71 | g |
| 72 | h |
| 73 | i |
| 74 | j |
| 75 | k |
| 76 | l |
| 77 | m |
| 78 | n |
| 79 | o |
| 80 | p |
| 81 | q |
| 82 | r |
| 83 | s |
| 84 | t |
| 85 | u |
| 86 | v |
| 87 | w |
| 88 | x |
| 89 | y |
| 90 | z |
| 91 | { |
| 92 | | |
| 93 | } |
| 94 | → |
| 95 | ← |
| 96 | |
| 97 | |
| 98 | |
| 99 | |

The decoded characters are applied by the main CPU 24 to the random access memory 60 in ASCII character encoding format and to the LCD driver 62' which provides power and logic for their display on the LCD display 64'. The LCD display 64' is of a dot matrix type and has a display area 64' which time multiplexes displays as follows. When a page is received, the main control program causes the display 64' to flash with the address location in memory where the page is stored. In response to the flashing of the display 64' as described above, the wearer of the paging receiver presses switch 70 which causes the location header to be displayed. The location headers are "LOCAL" indicating if the page originated in the same area where the paging receiver normally receives pages or "NATIONAL" or "REGIONAL" indicating that the page did not originate in the area where the paging receiver has received the message. In response to the location header, the wearer of the paging receiver presses switch 70 which causes the page to be displayed on display 64' which is stored in the memory area of RAM 60 which was flashed initially. It should be understood that alternatively separate display areas for the memory location header, location header, and page displays may be provided.

IV. Battery Saving

The paging receiver 16 has predetermined scanning time intervals necessary for detecting the presence of the carrier signal, the presence of individual code transmissions (toes) and to cyclically scan up to the 15 possible channels in the channel memory 62. In the embodiment of FIG. 1, the scanning time necessary to detect only the presence of the carrier of the channel is 315 milliseconds for all 15 channels which may be received if the area channel section 66 is completely programmed. It takes approximately 10 milliseconds for the phase lock loop 28 to respond to a channel to be received and another approximately 11 milliseconds for the amplifier and mixers 18, 20 and 22 to respond to the presence or absence of the channel. When a carrier is detected, it takes approximately 33 milliseconds for it to be received by the RF tuner 16 and processed by the main CPU 24 to determine its identity and to compare it with the stored paging receiver identification code as described below. When the channels of the channel memory 62 are cyclically scanned, the RF tuner 16 in the embodiment of FIG. 1 is powered up once every 900 m.s. for a period of 15 minutes at which time the reception by the RF tuner is stopped under the control program.

Each paging receiver is issued a unique paging receiver identification code. A preferred form of the paging receiver identification code is described below in FIG. 4 with reference to a memory map of the paging receiver identification code memory which is located within the random access memory 60. It should be understood that the invention is not limited to the number of digits as described below in the preferred form of the paging receiver identification code and further that is used herein "digit" means any number in any numbering base with the preferred numbering base of the present invention for paging receiver identification codes being base 10. With respect to FIG. 4, each paging receiver identification code 90 is comprised of a group of three most significant digits 92 which have regional significance and are referred to as an "area designation code". In a preferred form of the present invention, these digits are the telephone area code of the location where the person normally wearing the paging receiver resides. For international use, the country code may also be added as an area designation code. Five additional digits 94 of decreasing significance are used to distinguish each bearer of a paging receiver in the particular area identified by the area designation code 92. In a preferred form of the invention, a command is issued by the local channel transmitter to which the paging receiver is normally tuned to receive messages for programming the eight digit paging receiver identification code 90 for storage in the RAM 60. An eight digit paging receiver identification code 90 was chosen in the preferred embodiment of the present invention for the reason that it permits a total of 100,000,000 paging receivers to be uniquely identified in a base ten numbering system. In the preferred form of the present invention, while individual characters are sent by successive tone modulations of a frequency modulated carrier with sixteen possible values per frequency tone, the paging receiver identification codes are issued in a base ten numbering system for the reason that it is easier for most users to understand a base ten numbering system than a base sixteen numbering system.

Figure 4:
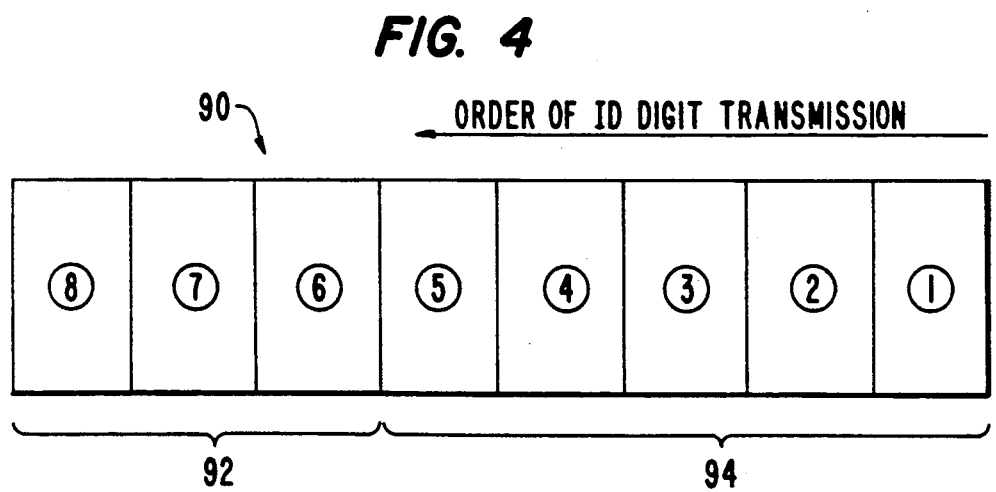
FIG. 4 is a diagram illustrating the order of transmission of the digits of the paging receiver identification code.

A significant feature of the present invention in prolonging battery life in the individual paging receiver is that the paging receiver identification code identifying the paging receiver to which a page is directed is sent with the digits in an order to increasing significance. With reference to FIG. 4, the right-most least significant digit is sent first followed by digits of increasing significance as identified by the circled numbers in each of the individual digits of the paging receiver identification code 90 and the arrow above the individual digits labelled "ORDER OF ID DIGIT TRANSMISSION". The paging receiver identification code is processed by the paging receiver in the order of increasing significance of the digits as described with respect to FIG. 4.

In a system with 1,000 paging receivers, the following example demonstrates the battery life saving achieved by the present invention for paging receivers having identification codes 93110000 through 93110999 with the present invention as contrasted with the prior art. If the paging receiver identification code digits are sent in the order of decreasing significance as in the prior art, which is the opposite of the order illustrated in FIG. 4, each paging receiver will respond to the first five digits. Assuming three pages per day, per paging receiver, the paging receiver will turn on RF tuner 16 3000 times per day. If it assumed that each cycle of turning on the RF tuner 16 consumes 300 milliseconds of on time, then each paging receiver will have its RF tuner 16 on for fifteen minutes per day. With the present invention, when the paging receiver identification code is sent in an order of increasing significance of the digits, as illustrated in FIG. 4, 900 paging receivers will immediately turn off after the transmission of the first digit because there will be no match between the first digit transmitted with the page and the stored paging receiver identification code digit as illustrated in FIG. 4. Upon the transmission of the second digit, ninety more paging receivers will turn off. Upon the transmission of the third digit nine more will turn off. With the same 3000 pages per day, the average time a pager will be on is only one minute per day. This produces a 93.4% reduction in battery consumption attributed to the turning on of the RF tuner 16 to merely determine if a page is possibly to be received on a channel to which the paging receiver has been programmed to receive. If a system is expanded to 10,000 pages, the battery savings will be increased with the on time in a system in accordance with the prior art in which the paging receiver identification code digits are sent in the order of decreasing significance being two and one-half hours per day versus only ten minutes per day of on time when the digits of the paging receiver identification code are sent in the order as described in FIG. 4 with it being assumed that the RF tuner 16 on time is the same as described above.

V. Channel Scanning

The operation of the paging receiver in turning on to detect the presence of a channel on one of the channels which it is programmed to receive and the scanning of a plurality of channels of the channel memory 62 is described as follows. Upon turning on of the paging receiver, the channel of the operating channel 64 is sampled for 15 minutes. If one of the amplifier mixer sections 18, 20 and 22 does not detect a tone frequency (a 0–9 tone of 690 milliseconds) of the operating channel section, within 15 minutes, the paging receiver will scan the channel stored in the operating channel memory section 64. If there is no detection of any receptions after the 30 minutes of scanning, the operating program of the main CPU 24 will turn off the RF tuner 16 and display on the message portion 68 of the display 64' "out of range" and activate a beeper.

In the embodiment of the invention illustrated in FIG. 1, when the paging receiver 10 is scanning the channels stored in the memory 62, it is searching for the presence of an RF carrier and the paging receiver identification code. When no carrier is present, the RF receiver 16 will turn on and detect that no carrier is present in approximately 11 m.s. of time and progresses to the next channel stored in the channel memory 62 as indicated by the "ORDER OF CHANNEL RECEPTION." When a last digit of the paging receiver identification code is detected for two consecutive on intervals of the RF tuner 16, the paging receiver will stay on that particular channel for the duration of the paging receiver identification code which spans 1912 milliseconds in the preferred embodiment. Each time carrier from one of the channels is detected or the paging receiver identification code is detected, the fifteen minute timer is reset. This allows the paging receiver to remain on a channel. The paging receiver then samples the channel once every 900 milliseconds for an 11 or 33 m.s. duration to respectively detect if carrier is present and, if so, to identify the code which was transmitted.

The full channel scanning mode of the paging receiver as described above with respect to FIG. 2 requires a sampling time on each channel of approximately 11 milliseconds to detect the carrier wave or 33 milliseconds to fully detect a code transmission depending upon the presence of a carrier signal. If no carrier is present, the paging receiver will detect the lack of a carrier within 6 milliseconds and scan to the next channel. When a carrier is detected, the pager will look for tones 0-9 during the sampling time interval of approximately 33 milliseconds. If a tone is detected, it is stored in the random access memory 60 and scanning of the channels in the full scanning mode as described with respect to FIG. 2 above is continued. When the RF receiver then again receives the same channel, a sample is taken. If a tone is still present, and it is the same tone stored in the random access memory 60 on the previous sampling interval, a match occurs with the previous digit and sampling sequentially occurs with successive digits of the paging receiver identification code until either a match is found in which case the main CPU 24 executes one of the commands described below or a match is not found in which case the RF tuner 16 is turned off and the cyclical sampling every 900 milliseconds continues.

VI. National, Regional, Remote Area, Local, Sublocal and Group Paging

When it is desired to program the paging receiver 10 to receive a fixed channel in a local area for purely local operation, programming may be accomplished manually or automatically. As used herein, "local" identifies an area identified by the area designation code 92. Automatic programming is done with the channel programming command AC with the desired operating channel being sent twice to the pager as described below. The operating program for the main CPU 24 recognizes the sequential sending of the same channel twice by a channel programming command and stores the repeated channel in the area channel section 66 and operating channel section 64. By storing only a single channel in the operation channel section 64 and the area channel 66, the paging receiver is forced to receive only a single channel which is desirable for local operation.

Nationwide, regional, remote area, sublocal and group paging by the paging receiver is programmed as follows. In order to differentiate nationwide, regional (a plurality of areas including one or more areas outside the area identified by the area designation code), remote area (an area other than the area identified by the area designation code), sublocal (a part of an area within an area identified by the area designation code) and group (one or more paging receivers located within the local area) paging from local paging, the paging signal contains a "destination code" having one or more characters which precede the paging receiver identification code that are not recognized by a paging receiver as part of a local page. This ensures that only persons to receive national, regional, remote area, sublocal and group pages will be alerted when transmission occurs. In a preferred form of the invention, the "destination code" is a letter, which is transmitted prior to the code. Paging receivers which are to receive national, regional, remote area, sublocal or group pages are programmed by the channel programming command to store a destination code as a header on the channel frequency. Thus, on a particular channel where some pages are transmitted with destination codes, only the first digit of each page is required to be compared with the stored destination code to enable an identification by a paging receiver programmed to receive pages with destination codes if a page is potentially directed to that paging receiver. The paging receiver tuner 16 which has been programmed with a destination code immediately turns off when a match is not found between the first digit of a page on a received frequency and the stored destination code thereby saving power required to compare the following digits of the stored and transmitted paging receiver identification codes as described below.

Figure 5:
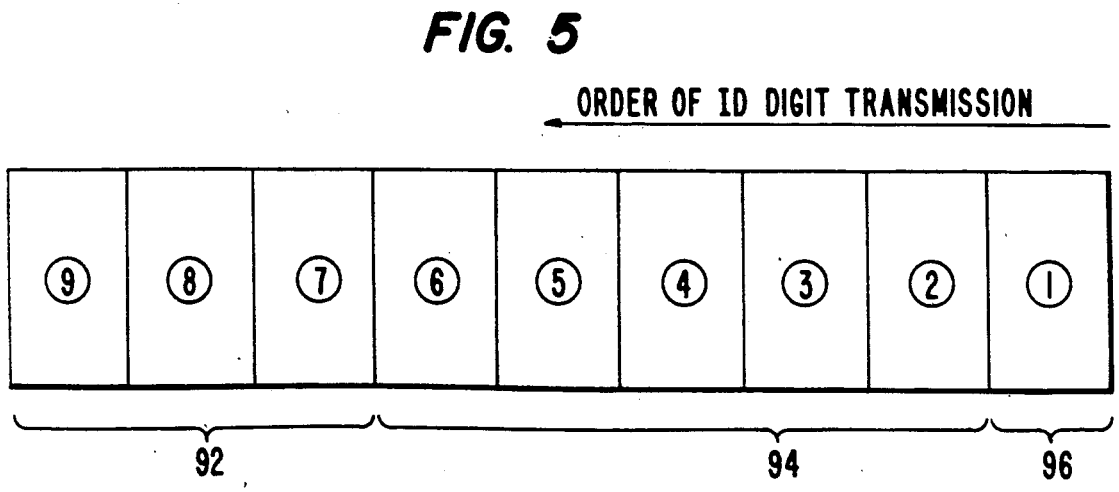
FIG. 5 is a diagram illustrating the order of transmission of a destination code and the digits of the paging receiver identification code.

FIG. 5 illustrates the order of transmission of the destination code and the digits of the paging receiver identification code for pages which are to be received with use of the destination code. Like reference numerals in FIGS. 4 and 5 are used to identify like parts. The first digit which is transmitted is the destination code 96. Thereafter the individual digits of the paging receiver identification code are transmitted in an order of increasing significance as described with reference to FIG. 4. When it is desired to program a paging receiver to receive pages with use of the destination code, the individual channels of the area channel section 66 of memory 62 are programmed by the channel programming command as described below. However, the first digit of the channels which are to be programmed to be received by the channel programming command contain the destination code 96 character such as the letter A, B, C, etc., which is not recognized as part of a paging receiver identification code, which preferably are base ten numbers. When a paging receiver receives the first digit of the paging receiver identification code, that digit is compared with the first digit of the channels stored in the area channel section 66. If a match occurs, the operating program of the main CPU 24 causes the RF tuner 16 to stay in an on state to compare the subsequent digits of the received paging receiver identification code with the stored paging receiver identification code. If there is no match between the first digit of the transmitted page and the destination code, then the paging receiver RF tuner 16 is immediately turned off to save battery power. By turning off the paging receiver tuner 16 immediately upon the detection of no match between the destination code 96, when the paging receiver is transported to a remote area its on time to receive pages will not be influenced by pages "local" to the remote area for the reason that the first digit mismatch which must occur when any page originating from an area into which the paging receiver has been transported will immediately be detected as a mismatch causing the RF tuner 16 to be turned off.

Figure 6:
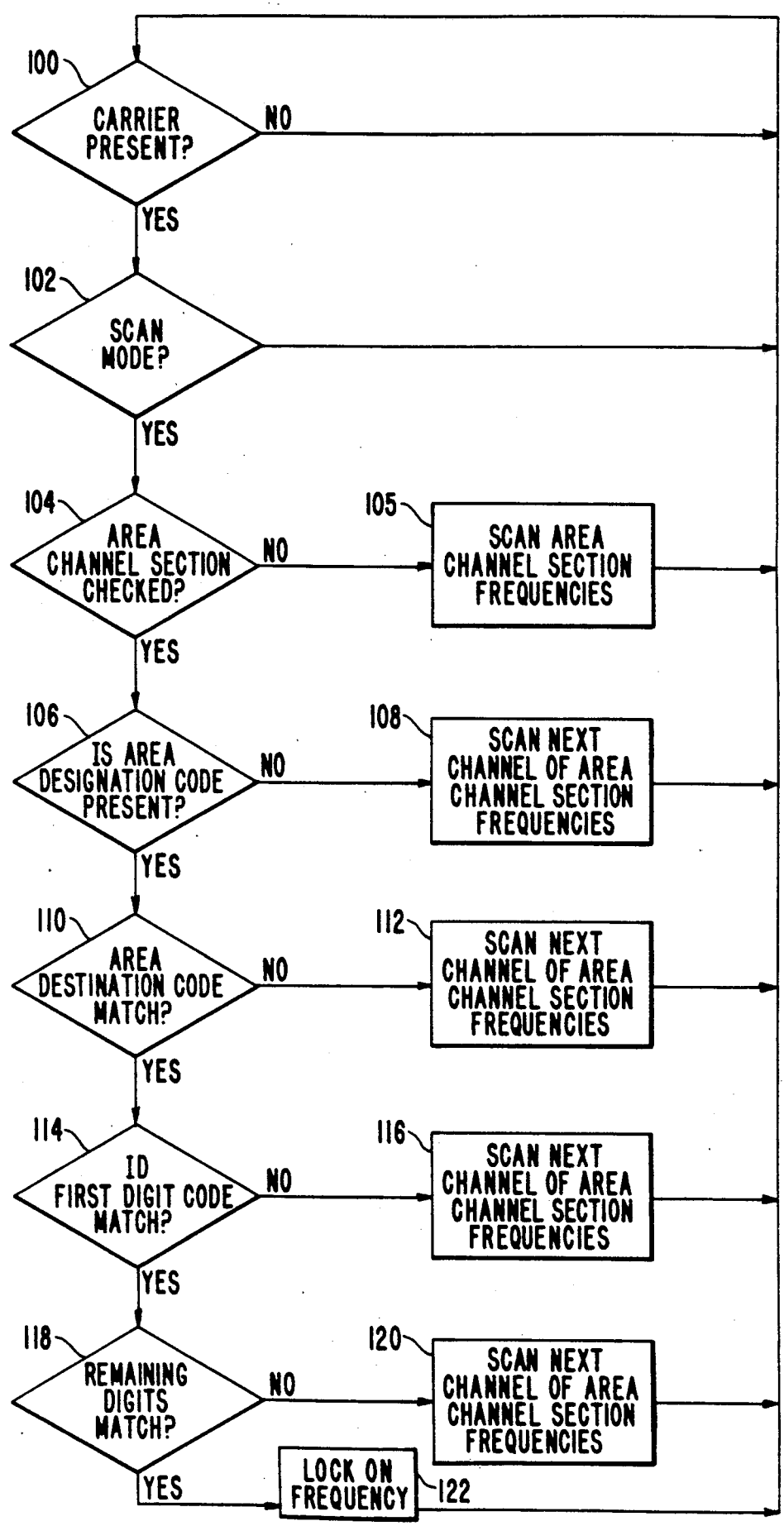
FIG. 6 is a flowchart illustrating the order of scanning the channels, of the channel memory and processing of the destination code and the paging receiver identification code.

FIG. 6 illustrates a flow chart illustrating the operation of the control program of the main CPU 24 in scanning channels including the processing of pages transmitted with destination codes. The program starts at point 100 where the channel of the operation channel section 64 is scanned by the RF tuner 16. If channel carrier is not present, the RF tuner 16 turns off for 900 milliseconds and then again checks if carrier is present. If carrier is present, the operating program proceeds to point 102 where a determination is made whether or not the program is in the scanning mode in which the channels of the operating channel section 94 and area channel section 96 are sequentially scanned for an interval of 30 minutes as illustrated in FIG. 2. If the program is not in the scanning mode, which is indicative of only the operation channel section channel 94 frequency being scanned, the program proceeds back to point 100. If the answer is "yes" at point 102, the program proceeds to point 104 to check if the channels of the area channel section 66 have been checked. If the answer is "no", the program proceeds back to point 105 where the channels of the area channel section are scanned. The program then proceeds back to point 100. If the answer is "yes" at point 104, the program proceeds to point 106 to determine if a destination code 96 is present on the channel being received. If the answer is "no", the program branches to point 108 where the next channel in the area channel section 66 is scanned. The program proceeds from point 108 to point 100. If the answer is "yes" at point 106 that a destination code 96 is detected, the program proceeds to point 110 where a comparison is made between the transmitted destination code and any destination code which is stored in the channels of the area channel section 66. If the answer is no at point 110, the program proceeds to point 112 where the next channel within the area channel section 66 is received. If the answer is "yes" at point 110, the program proceeds to point 114 to compare the first digit of the paging receiver identification code transmitted on the channel with the stored paging receiver identification code. If there is no match at point 114, the program proceeds to point 116 where the next channel of the area channel section 66 is scanned. If the answer is "yes" at point 114, the program proceeds to point 118 where the remaining digits of the paging receiver identification code are compared. If the answer is "no" at the comparison of any one of the remaining digits of the paging receiver identification code at point 118, the program proceeds to point 120 to scan the next channel of the area channel section 66. If the answer is "yes" at point 18, the paging receiver locks on the channel at point 122 by setting the phase lock loop 28 to continue to receive that channel and the following command is decoded by the operating program of the main CPU 24 and executed.

VII. Commands

An important part of the present invention is the command structure which permits the functionality of the paging receiver to be changed dynamically by the transmitter in a manner not achieved by the prior art. All commands which are executed by the main CPU 24 are sent according to a protocol. An example of the paging protocol is set forth below with a nationwide telephone number page to paging receiver ID 789 12345 with telephone number 424, 6464 and a warble tone.

```
FF--5--B4 BE321 BE987 A7424 DE6464 AEA
 NOTES  1  1A2   2    3     4    5
```

FF—provides 66 m.s. of silence prior to page.

NOTE 1—is the last digit of the paging receiver identification code which is sent first as the preamble. If the page is a group page, a C may be substituted for the 5.

NOTE IA—When a "B" appears after the preamble digit, the person receiving the page will be alerted that a "batched" page is receivers.

NOTE 2—The BE's are received by the paging receiver and ignored and provide time spacing.

NOTE 3—A7. The A signifies that a command sequence follows. The 7 indicates the message is numeric, and illuminates the nationwide origin display and telephone messages.

NOTE 4—DE's are sent during the data portion of the transmission to allow overlay operation.

NOTE 5—AEA or AE indicates the end of transmission and the type of alert tone to use e.g. warble.

The operating program of the main CPU 24 is programmed to respond to a command repertoire explained as follows. A command sequence immediately follows the pager receiver identification code and always begins with a tone "A" followed by the command tone. Set forth below is a command table explaining the command structure.

COMMAND TABLE

| | |
|---|---|
| A0 | BATTERY SAVE |
| A1 | REPEAT |
| A2 | PROGRAM ID |
| A3 | LOCAL & NUMERIC (16 NUMBERS) |
| A4 | LOCAL & MESSAGE - ALPHA (511 CHAR) |
| A5 | NATIONAL & NUMERIC (16 NUMBERS) |
| A6 | NATIONAL & MESSAGE - ALPHA (511 CHAR.) |
| A7 | ALPHA FIXED MEMORY LOCATION |
| A8 | RESERVED |
| A9 | EXT DATA (OPENS AUDIO TO EXIT JACK) |
| AA | DO NOT USE! |
| AB | OUT OF SERVICE |
| AC | CHANNEL PROGRAM |
| AD | SUBLOCAL PAGERS FROM RESTRICTED AREAS OR GROUPS OF PAGING RECEIVERS |
| AE | DO NOT USE! |

A0 Battery Save

The battery save command is followed by a two digit decimal format indicating how many seconds the paging receiver should sleep before beginning its channel sampling. It is followed by an AE message terminator with no tone alert necessary. The two digit number represents the number of 10 second increments to sleep with a maximum of 990 seconds (16.5 minutes).

A022AE=220 second sleep period

A099AE=990 second sleep period

A1 Repeat Page

The repeat command indicates that the page being sent is a repeat of the previous page. The previous message display will be used, and the numeric or alphanumeric page should match a previous page which has been stored in the random access memory 60 during the execution of the A3-A6 commands which cause a page to be stored in the random access memory. If a page match is detected by the paging receiver, the page is discarded. If the first page was not received, the page should be stored in the random access memory 60 and the wearer of the paging receiver alerted. The status display will show "RPT" indicating a repeat page and the first page was not found in memory, i.e., A1, A3 424DE6464AE REPEAT 424-6464 (local, numeric, which is the execution of command A3 described below)

A2 Program ID

The program ID command is used to send a new paging receiver identification code to the paging receiver. The previous paging receiver identification code will be overwritten by this command. No tone alert is necessary, but the paging receiver should display the new paging receiver identification code as a page, i.e.,

CHANGE 789 12345 TO ID 789 45678

A2789DE4567DE8AE (NEW ID)

A3 Local & Numeric (16 Digits)

The A3 command sequentially illuminates the display 64', indicating the page is of local origin, and a numeric telephone number display as a page. This command is used by a local transmitter to transmit pages originating within the area identified by the area designation code. The main CPU 24 will receive and decode the page accompanying the A3 command with characters of the page being decoded in a single digit format, i.e.,

A3956DE1030AE TEL # 956-1030

The maximum numeric message length is 16 digits.

A4 Local & Alphanumeric (511 Characters)

The A4 command sequentially illuminates the display 64', indicating the page is of local origin and an alphanumeric display as a page. The alphanumeric format is sent with each character being encoded as a two digit number as explained above. The main CPU 24 will receive and decode the page accompanying the A4 command with each character being decoded as two successive digits. The message length will be 511 characters or less. This command is used by a local transmitter to transmit pages originating within the area identified by the area designation code 92.

The message length when in the alphanumeric mode will be 511 characters in length. The display will flash, indicating the message is 511 characters long, i.e., IBM STOCK 5124 ¾
(18 CHARACTER MESSAGE)
```
A4 73 66 DE 77 32 DE 83 84 DE 79 67 DE 75 32 DE 36
   1 B    M SP   S T   O C    K SP   S ∗
DE 75 32 DE 36 49 DE
   K SP   S 1
50 52 DE 32 51 DE 47 52 AE
 2 4    SP 3    / 4    (56 CHARACTER 1.848 SEC.)
```

A5 National & Numeric (16 Digits)

The A5 command sequentially illuminates the display 64', indicating that the origin of the page is not local and a numeric message as a page. This command is used by a local paging service, within the area identified by the area designation code, which relays a page to a transmitter located at a remote area where a paging receiver is to receive a page transmitted by the transmitter located at the remote area. The main CPU 24 will receive and decode the page accompanying the A5 command with characters of the page in a single digit format, e.g.,

TEL # 956 1001

A6956DE10EIAE (
NOTE: REPEAT DIGIT FOR SECOND ZERO)

A6 National & Alphanumeric (511 Char.)

The A6 command sequentially illuminates the display 64', indicating that the origin of the page is not local and an alphanumeric message as a page. This command is used by a local paging service, within the area identified by the area designation code, which relays a page to a transmitter located at a remote area where a paging receiver is to receive a page transmitted by the transmitter located at the remote area The page which is sent in a two digit decimal order with the number field being 01-99 in the same manner as explained above. The main CPU 24 will receive and decode the page accompanying the A6 command with each character being decoded as two successive digits.

The maximum message length is 511 characters. The example is identical to the A4 command discussed above with the first two tones being A6.

A7 Alphanumeric Specific Message Memory

The A7 command permits a subset of commands to follow. The digit immediately following the A7 command will indicate in which section of addressable sections of the random access memory 60 to place the message. If a message exists in this memory location of the random access memory, it will automatically overwrite the message memory. The command subset will be 1-4 indicating memory locations 11-14. An ordinary message will not overwrite the 11-14 message locations. The message will immediately follow:

A7 1
A7 2
A7 3
A7 4

The message locations 11-14 will only be overwritten by messages with the same command (e.g. memory location 11 will only be overwritten by the A7 (1) command) or erased by the user. The message type will always be "Special Call" and will be sent as an alphanumeric message.

A8 Reserved

A9 External Date Message

The A9 command alerts the person being paged that the audio must be routed to the external data jack 67 for remote processing. The paging receiver will forward the audio to the external data jack 67 until the AE message is received, indicating end of data transmission, i.e. A9—DATA—AE.

AA Invalid

The AA command cannot be used, as it would be processed by the main CPU 24 as an AE (end of file) command.

AB Out of Service

The AB command will illuminate an out of service display on the memory section 68 of the display 64', and may or may not have numeric data following. This command may be used when system maintenance is required, or to alert the wearer of the paging service that service is being denied, until the bill is paid, i.e. ABAE (illuminates out of service message upon turn on and for two seconds).

The paging receiver still receives messages as normal. The out of range display turns on. The LCD display 64', displays "out of service" until the next page is allowed. The switching system will prevent any messages from being sent to the pager.

AC Channel Programming

The AC channel programming command alerts the person wearing the paging receiver that channel programming information is forthcoming. The channels are stored in the channel memory 62 transmitted as four digit decimals numbers, each separated by the DE delimeter. As explained above, up to 15 channels may be loaded into the area channel section 66 or the operation channel section 64. A preceding V indicates VHF, a U UHF, a J indicates Japan and an E indicates . Europe.

When only one channel is desired, such as for local paging, the channel is repeated at least twice, to alert the paging receiver that only one channel is desired to be programmed in the area channel section 66 of the channel memory 62. All previous channels in the area channel section 66 of the channel memory 62 are erased. The memory cells have the new channel number entered to fix the paging receiver to receive a single channel. The memory cells will remain programmed until the next channel reprogramming of the paging receiver, i.e.

AC0123DE0123AE (CH.V 123 NO SCANNING)

A C 0 E 1 0 D E 0 1 0 7 D E 0 2 1 0 D E 1 0 5 0 D E 7 A E A (CH.v10,v107,u210,u50).

The channel programming sequence is as follows:

| | |
|---|---|
| 0001 - 0DDD | VHF 5 KHz steps |
| 1001 - 1DDD | VHF 6.25 KHz steps (Europe) |
| 2001 - 2DDD | UHF 5 KHz steps |
| 3001 - 3B2B | 280 MHz 2.5 KHz steps (Japan). |

Channel codes 4001, 5001, 6001, 7001, 8001, 9001 are open for additional channels to be added. The total upward reserve channel capacity in ROM 58 is 16,458 channels.

The following sub-commands are utilized for instructing the main CPU 24 to perform functions pertaining to the programming of channels.

NO Command (Add One Channel)

When no sub-command is sent, one channel is to be added to the area channel section 66. e.g. AC 0237 DE 7AEA (add VHF channel 237 to area channel section 66).

Sub-command 4000 (Typically Regional)

When 4000 is transmitted, it erases the entire area channel section 66 and the operation channel section 64 of the channel memory 62 and cannot be used in adjacent areas which must be programmed with the 6000 sub-command. e.g. AC 4000 DE 0156 DE 2132 DE 7AEA. This command erases and stores VHF 156 and UHF 132 channels in the area channel section.

Sub-command 5000

When 5000 is transmitted, the destination code may be programmed. This command erases the operating channel 64 and the area channel section 66 and forces the reception of a particular channel. The command is used for dynamic frequency agility. The paging receiver is fixed to receive a fixed channel. e.g. AC 5000 DE 0171 DE 7AEA. This command erases the operating channel 64 and the area channel section 66 and forces the paging receiver to VHF channels 171, causing the operating channel section 64 to store VHF channel 171.

Sub-command 6000 (National)

This command is divided into the loading of the 15 possible destination codes 96 and the channels.

ACB6122 DE0200 DE0000 DE0000 DE0000
DE0212 DE0311 DE0408DE2511 DE2139
DE7AEA

This represents the 6000 national command followed by the destination code 96 or local code for each of the 15 possibles in the area channel section. The five channels follow and will be as follows:

6122 National, channel 1=A, channel 2=B, channel 3=B
0200 Channel 4=local, channel 5=B, filler code
0000 Channel 8=11, filler code
0000 Channel 12-15, filler code
0212 VHF channel 212
0311 VHF channel 311
0408 VHF channel 408
2511 UHF channel 511
2139 UHF channel 139
7AEA Stop channel command.

Channel Programming Termination (7AEA)

The channels to be sent to the paging receiver are sent in the following order:
0XXX channels (VHF) (ascending numerical order)
1XXX channels (VHF Europe)
2XXX channels (UHF Europe)
3XXX channels (280 MHz).

The last channel sent is actually a terminate message code. It is 7AEA (7AAA). The paging receiver will receive the last frequency code and immediately terminates the page. The 7AEA terminate frequency code is necessary at the end of every AC channel program message. During the transmission of channel codes, the AEA code may appear (e.g. channel 1AEA). In order to prevent termination of the message, the AC command changes the AEA termination command to 7AEA. 7AEA is an invalid channel code.

AD Company COMMAND

The AD command allows a 32 alphanumeric character company message to be sent to the paging receiver. The message is always alphanumeric, e.g., AD 4247, DE 4637, DE 5100, DE 4833, DE 3941, DE 4639, AE Jones Paging.

When a company message is desired, it will be sent after the paging receiver identification code has been programmed. When the paging receiver is turned on, the company message will be displayed instead of a self test message which is typically used. If no company message resides in the paging receiver, the self test message will display.

The 32 character part of the random access memory 60 is battery protected to permit the message to permanently reside in the paging receiver. It may be changed by simply sending a new AD command and message to the pager. This permits the company message to be changed at will.

AE-Invalid

The AE command cannot be used, as it cannot be encoded and also conflicts with the end of file command.

End Of Page Command AE or AEA

All pages require the end of page command. The end of page command serves a two fold purpose indicating the end of transmission and determines the type of tone alert.

$AE = 2041 hertz-50\%$ duty cycle-2 seconds $AEA = 2041 hertz-25/75\%$ duty cycle-2 seconds Certain commands do not send a tone alert. A listing of the commands is as follows:

| A0 | BATTERY SAVE | (NO ALERT) |
| A1 | REPEAT | (NO ALERT) * |
| A2 | PROGRAM ID DISPLAY ID | (ALERT) - |
| A3 | LOCAL & TEL NUMERIC | (ALERT) |
| A4 | LOCAL & SP ALPHA | (ALERT) |
| A5 | NAT. & TEL NUMERIC | (ALERT) |
| A6 | NAT. & ALPHA | (ALERT) |
| A7 | ALPHA FIXED MEMORY | (ALERT) |
| A8 | UNASSIGNED | (ALERT) |
| A9 | SPECIAL & DATA AUDIO | (ALERT) |
| AB | OUT OF SERVICE | (ALERT) |
| AC | CHANNEL PROGRAM | (ALERT) |
| AD | COMPANY MESSAGE | (ALERT). |

* AL will alert if first page was not received or if previously erased.

VIII. Remote Area Paging

Figure 21:
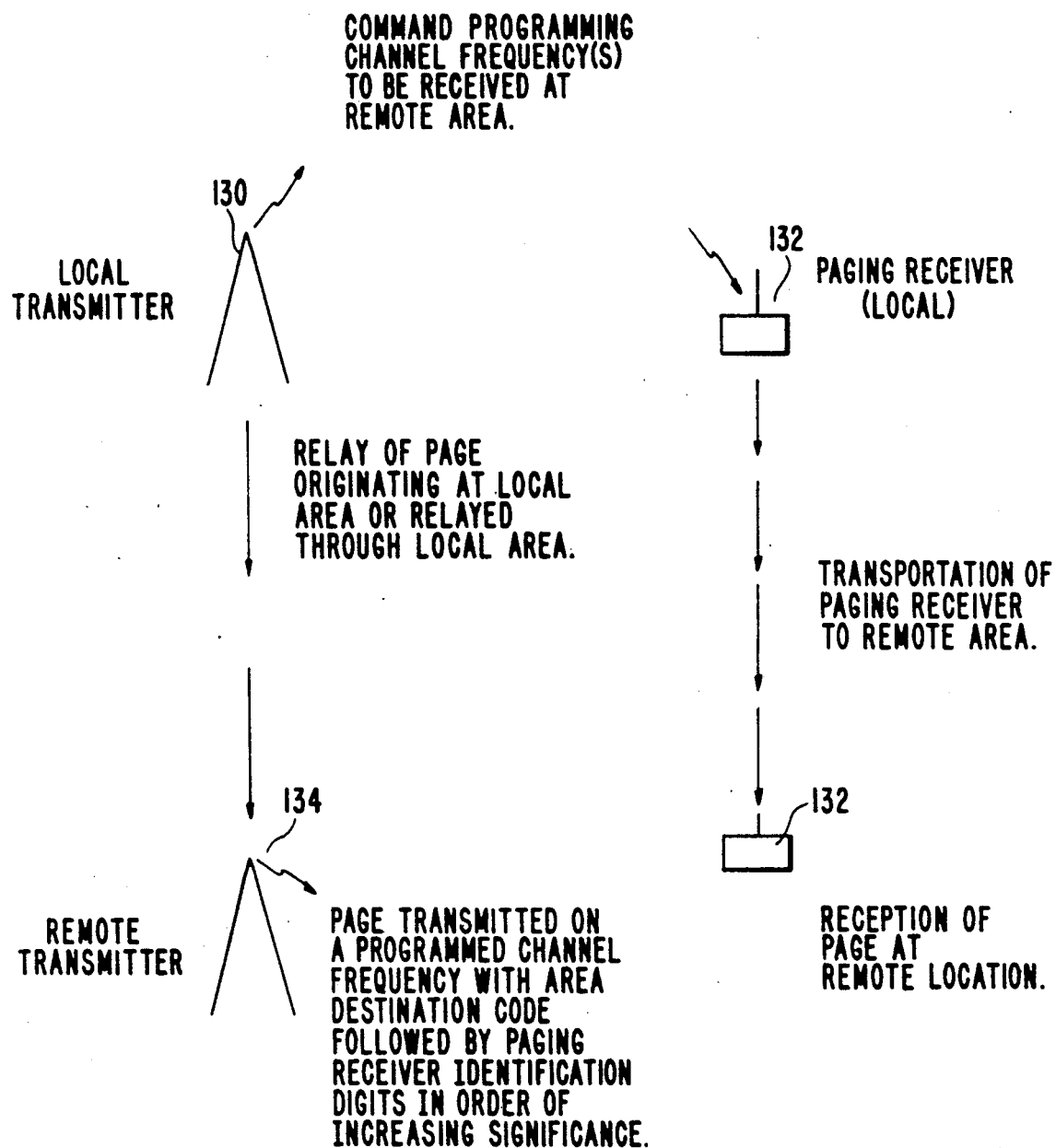
FIG. 21 illustrates the operation of the present invention in making a page to a remote area.

FIG. 21 illustrates the operation of the present invention in receiving pages at a remote area. A local transmitter 130 transmits one or more channel programming commands as described above which specify one or more channels on which a paging receiver 132 is to receive pages while located at a remote area. The channel frequency changing commands are received by the paging receiver 132 while it is located in transmission distance of the local transmitter 130. The one or more channel programming commands specifying the one or more channels to be received in the remote location also include the destination code 96 described above used to differentiate pages to be received by the paging receiver 132 while in the remote area from pages originating in the remote area on the same one or more programmed channels. The paging receiver 132 is transported to the remote area as indicated by the downwardly pointing vertical arrow in the right-hand portion of FIG. 21. The downwardly pointing vertical arrow in the left-hand portion of FIG. 21 illustrates the relaying of a page originating at the local area or relayed through the local area to a remote transmitter 134 located in the remote area where the page is transmitted by transmitter 134 and received by the paging receiver 132. The remote transmitter 134 sequentially in time transmits the destination code as the first character which is transmitted, the paging receiver identification code digits in an order of increasing significance and the actual page. The paging receiver 132 while in the remote area compares the first digit of each transmission on the one or more channels that the paging receiver is programmed to receive with the stored destination code. If there is a match between the first character transmitted with a page on the one or more channels that the paging receiver 132 is programmed to page and the destination code, the paging receiver 132 compares the subsequent digits of the transmitted paging receiver identification code following the destination code in an order of increasing significance with the stored paging receiver identification code digits. The RF tuner of the paging receiver is immediately turned off upon a mismatch of either the destination code or one of the digits of the transmitted and stored paging receiver identification code. If the transmitted and received destination codes and paging receiver identification codes match, the page is displayed on the display 64'. It should be noted that pages originating in the remote area will not cause the RF tuner 16 to be turned on past the point in time of transmission of the destination code because of the mismatch which will occur thereby saving the battery of the paging receiver.

A method of the present invention in paging a sublocal area within an area or a group within the local area such as a company is as follows. The paging receiver is programmed with the channel programming command to receive one or more frequencies. The destination code is used in the same manner as described above with regard to FIG. 21 in identifying pages to be received in a remote area except that it is assigned to paging receivers within part of the local area (subarea) or to paging receivers belonging to a group such as a company. The destination code is transmitted with the channel programming command to identify one or more channels on which pages on a sublocal or a group level are to be detected. Thereafter, the paging receiver which has been programmed to receive on the programmed one or more channels on a sublocal or a group basis compares the first digit of each transmission occurring on the one or more programmed channels to detect if there is a match between the destination code stored in the channel memory 62 and the first character which is transmitted. If there is no match, the RF tuner 16 is immediately shut off thereby saving the battery of the paging receiver. If there is a match, the paging receiver compares the transmitted digits of the paging receiver identification code in an order of increasing significance with the stored paging receiver identification code digits. If there is a mismatch between any one of the paging receiver stored and transmitted paging receiver identification code digits, the RF tuner 16 is immediately shut off. If there is a complete match between the destination code and the stored and transmitted paging receiver identification code digits, the paging receiver processes the subsequently transmitted page. Thus, it is seen that paging receivers may be programmed on a sublocal or on a group specific basis within a local area to receive pages on channels which are in widespread use in a local paging system while achieving battery savings by not turning on the paging receiver to receive subsequent digits of the paging receiver identification code for every transmission occurring on the programmed channels.

IX. FIGS. 7-20

As has been explained above, FIGS. 7-20 illustrate circuit schematics for implementing the blocks of FIG. 1. Integrated circuits are identified by their industry designation. It should be understood that other implementations of the blocks of FIG. 1 may be utilized in practicing the present invention.

Figure 22:
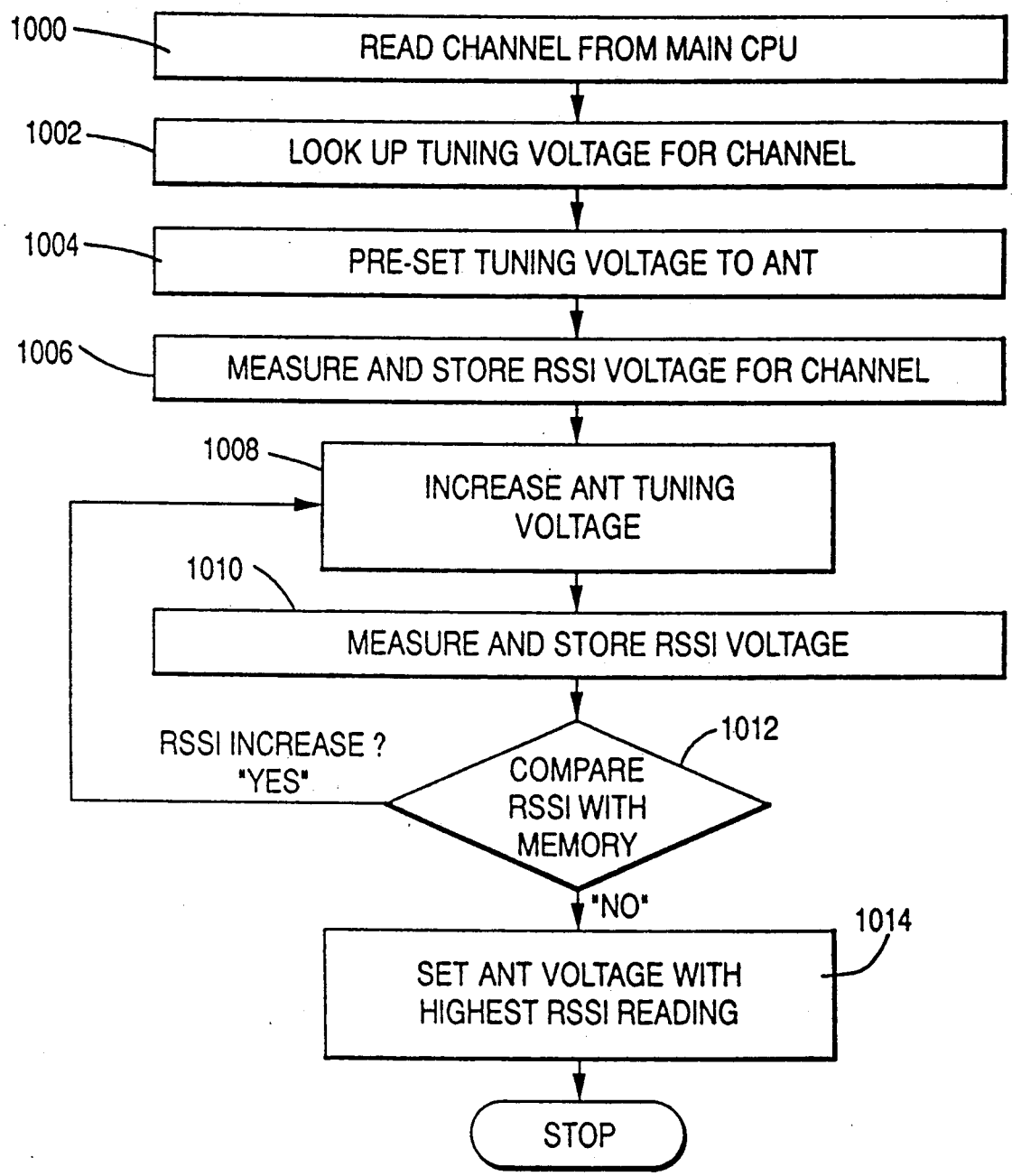
FIG. 22 is a flowchart illustrating the operation of the antenna controller in tuning the antenna of a paging receiver in accordance with the present invention.

FIG. 22 illustrates a flowchart of the operation of the antenna controller 44 with reference to FIG. 1 in producing the ANTENNA TUNING SIGNAL for optimizing the gain of the antenna 12 in receiving a specified channel which is outputted as indicated at point 1000 by the main CPU 24 and identified as the RECEIVER TUNING SIGNAL. The operation of the antenna controller 44 proceeds to point 1002 where a stored ANTENNA TUNING SIGNAL which is a function of the specified channel is read out from memory within the controller 44 and applied to the varicap diode(s) as indicated at point 1004 within the antenna circuit 14. Preferably, the stored ANTENNA TUNING SIGNAL sets the voltage to approximately 15% less than the voltage which will produce maximum antenna gain for the specified channel. Each 13 MHz band is divided into twenty-six lookup voltages stored in the memory of the antenna controller 44. The antenna controller 44 chooses for the specific band within which the specified channel is located the stored ANTENNA TUNING SIGNAL which is assigned to the specified channel for initial tuning of the antenna 12. Accordingly, each channel within each band of channels which may be received has an assigned initial ANTENNA TUNING SIGNAL stored in the memory of the antenna controller 44 which is approximately 15% less than the voltage which will produce maximum antenna gain.

The antenna controller 44 measures and stores the magnitude of the RSSI SIGNAL outputted by the IF processing signal circuit 34 as indicated at point 1006. The antenna controller 44 adds a predetermined incremental voltage increase to the previous ANTENNA TUNING SIGNAL which has been readout from memory as indicated at point 1008. At point 1010, the antenna controller 44 measures and stores the RSSI signal as outputted by the IF processing signal circuit 34 in response to the increased voltage. The antenna controller 44 compares at point 1012 the voltages which were stored at points 1006 and 1010 to determine if there is an increase. If the answer is "yes" at point 1012, the operation loops back to point 1008 to add another incremental voltage increase as described above with reference to points 1008 and 1010. If the answer is "no" at point 1012, the operation of the antenna controller 44 proceeds to point 1014 where the ANTENNA TUNING SIGNAL is set to correspond to the highest RSSI signal. Furthermore, the loop comprised of steps 1008-1014 may be run a plurality of times, such as three times, prior to finally setting the ANTENNA SIGNAL to determine the optional voltage level. The repeating of steps 1008–1014 enhances the optimizing of the ANTENNA TUNING SIGNAL. Once the "no" decision is reached at point 1012, the RSSI SIGNAL will have increased in magnitude, reached a maximum and decreased in magnitude. Operation of the antenna circuit 14 for the specified channel in receiving pages on the specified channel is in accordance with the ANTENNA TUNING SIGNAL as determined at point 1014.

While the invention has been described with the initial stored value of the ANTENNA TUNING SIGNAL contained in the memory of the antenna controller 44 being less (preferably 15%) than the voltage which produces optimum antenna gain, it should be understood that the voltages stored by the memory of the antenna controller may alternatively be larger with the incremental voltage steps at point 1008 being decreases in voltage. Furthermore, the percentage less than the voltage which produces maximum gain which is stored by the memory of the antenna controller may be chosen to be different than 15%. It should be understood that the programming of the antenna controller 44 to tune the antenna 12 in accordance with FIG. 22 may be by any known programming technique. Additionally, the antenna controller may be implemented in a non-ASIC architecture such as a custom integrated circuit.

While the invention has been described in terms of its preferred embodiments, it should be understood that numerous modifications may be made thereto without departing from the spirit and scope of the invention as defined by the appended claims. It is intended that all such modifications fall within the scope of the appended claims.

I claim:

1. A RF receiver which is tunable to at least one specified channel having a signal strength which varies as a result of variable antenna gain comprising:
   a tunable antenna which is tunable in response to an antenna tuning signal to vary antenna gain for the specified channel;
   a RF tuner, coupled to the tunable antenna, for receiving the specified channel in response to an applied channel tuning signal specifying reception of the specified channel;
   an intermediate frequency circuit, coupled to the RF tuner, for producing an intermediate frequency signal and a received signal strength indicator which is proportional to a level of the intermediate frequency signal;
   an antenna tuning circuit, responsive to the received signal strength indicator and to a fixed magnitude stored antenna tuning signal which is a function of the channel being received and which was stored prior to receiving the specified channel, for generating the antenna tuning signal which produces maximum antenna gain for the received channel; and
   a controller controlling generation of the applied channel tuning signal to cause the RF tuner to be tuned to receive the specified channel.

2. A RF receiver in accordance with claim 1 wherein:
   application of the stored antenna tuning signal to the tunable antenna causes the intermediate frequency circuit to produce a received signal strength indicator less than a received signal strength indicator produced with maximum antenna gain; and the antenna tuning circuit in response to the applied channel tuning signal specifying initial reception of specified channel changes the antenna tuning signal from the stored antenna tuning signal to produce a maximum level of the received signal strength indicator and applies the antenna tuning signal which caused the maximum level of the received signal strength indicator to be produced to the tunable antenna to produce maximum antenna gain for receiving transmissions on a received channel.

3. A RF receiver in accordance with claim 2 wherein:
   the antenna tuning circuit changes the antenna tuning signal from the stored antenna tuning signal to produce a maximum level of the received signal a plurality of times and thereafter applies the antenna tuning signal which caused the maximum level of the received signal strength indicator to be produced from the plurality of times the antenna tuning signal was increased for received transmission on a received channel.

4. A RF receiver in accordance with claim 2 wherein:
   the changing of the antenna tuning signal by the antenna tuning circuit is produced by incrementally changing the antenna tuning signals in steps to cause the received signal strength indicator to increase in magnitude, reach a maximum magnitude and decrease in magnitude.

5. A RF receiver in accordance with claim 4 wherein:
   the changing of the antenna tuning signal is in steps which increase the magnitude of the antenna tuning signal.

6. A RF receiver in accordance with claim 4 wherein:
   the changing of the antenna tuning signal is in steps which decrease the magnitude of the antenna tuning signal.

7. A RF receiver in accordance with claim 3 wherein:
   the changing of the antenna tuning signal by the antenna tuning circuit is produced by incrementally changing the antenna tuning signals in steps to cause the received signal strength indicator to increase in magnitude, reach a maximum magnitude and decrease in magnitude.

8. A RF receiver in accordance with claim 7 wherein:
   the changing of the antenna tuning signal is in steps which increase the magnitude of the antenna tuning signal.

9. A RF receiver in accordance with claim 7 wherein:
   the changing of the antenna tuning signal is in steps which decrease the magnitude of the antenna tuning signal.

10. A RF receiver in accordance with claim 1 wherein:
    the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

11. A RF receiver in accordance with claim 10 wherein:
    the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

12. A RF receiver in accordance with claim 11 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

13. A RF receiver in accordance with claim 12 wherein:
the channels to which the receiver is tunable are contained in a plurality of frequency bands with a plurality of fixed magnitude antenna tuning signals being stored for each band prior to receiving the specified channel.

14. A RF receiver in accordance with claim 2 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

15. A RF receiver in accordance with claim 14 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing o antenna tuning signal, storing and comparing the resultant and previous received signal strength indicators produced by the intermediate frequency circuit until the received signal strength indicator reaches the maximum.

16. A RF receiver in accordance with claim 15 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

17. A RF receiver in accordance with claim 16 wherein:
the channels to which the receiver is tunable are contained in a plurality of frequency bands with a plurality of fixed magnitude antenna tuning signals being stored for each band prior to receiving the specified channel.

18. A RF receiver in accordance with claim 3 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

19. A RF receiver in accordance with claim 18 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

20. A RF receiver in accordance with claim 19 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

21. A RF receiver in accordance with claim 20 wherein:
the channels to which the receiver is tunable are contained in a plurality of frequency bands with a plurality of fixed magnitude antenna tuning signals being stored for each band prior to receiving the specified channel.

22. A RF receiver in accordance with claim 4 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

23. A RF receiver in accordance with claim 22 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

24. A RF receiver in accordance with claim 23 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

25. A RF receiver in accordance with claim 24 wherein:
the channels to which the receiver is tunable are contained in a plurality of frequency bands with a plurality of fixed magnitude antenna tuning signals being stored for each band prior to receiving the specified channel.

26. A RF receiver in accordance with claim 5 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

27. A RF receiver in accordance with claim 26 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

28. A RF receiver in accordance with claim 27 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

29. A RF receiver in accordance with claim 28 wherein:
the channels to which the receiver is tunable area contained in a plurality of frequency bands with a plurality of fixed magnitude antenna tuning signals being stored for each band prior to receiving the specified channel.

30. A RF receiver in accordance with claim 6 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

31. A RF receiver in accordance with claim 30 wherein:
the antenna tuning circuit in producing the antenna tuning signal which produces maximum gain executes a recutting process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced y the intermediate frequency circuit until the received signal strength indicator reaches the maximum.

32. A RF receiver in accordance with claim 31 wherein:

the RF receiver channels in at least one frequency band with each frequency band containing a plurality of channels; and the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

33. A RF receiver in accordance with claim 32 wherein:
the channels to which the receiver is tunable are contained in a plurality of frequency bands with plurality of fixed magnitude antenna tuning signals being stored for each band prior to receiving the specified channel.

34. A RF receiver in accordance with claim 7 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

35. A RF receiver in accordance with claim 34 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

36. A RF receiver in accordance with claim 35 wherein:
the RF receiver receives channels in at least one frequency band with each frequency band containing a plurality of channels; and the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

37. A RF receiver in accordance with claim 36 wherein:
the channels to which the receiver is tunable are contained in a plurality of frequency bands with a plurality of fixed magnitude antenna tuning signals being stored for each band prior to receiving the specified channel.

38. A RF receiver in accordance with claim 8 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

39. A RF receiver in accordance with claim 38 wherein:
the antenna tuning circuit in producing the antenna tuning signal which produces maximum gain executes a recurring process of incrementally changing the antenna tuning signal, storing a resultant signal level produced by the intermediate frequency circuit, compares the resultant signal level with a signal level produced by the intermediate frequency circuit produced prior to incrementally changing the antenna tuning signal to determine if the incremental change in antenna tuning signal caused the resultant signal level from the intermediate frequency signal to increase; and repeats incremental changing of antenna tuning signal, storing the resultant signal and comparing the resultant and previous signal levels produced by the intermediate frequency circuit with the signal level produced by the intermediate frequency circuit reaches the maximum.

40. A RF receiver in accordance with claim 39 wherein:
the RF receiver receives channels in at least one frequency band with each frequency band containing a plurality of channels; and the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

41. A RF receiver in accordance with claim 40 wherein:
the channels to which the receiver is tunable are contained in a plurality of frequency bands with a plurality of fixed magnitude antenna tuning signals being stored for each band prior to receiving the specified channel.

42. A RF receiver in accordance with claim 9 wherein:
the antenna tuning circuit incrementally changes the antenna tuning signal until the received signal strength indicator produced by the intermediate frequency circuit reaches a maximum level and in response to the received signal strength indicator reaching a maximum level sets the antenna tuning signal to the antenna tuning signal which produced the maximum level in receiving the specified channel.

43. A RF receiver in accordance with claim 42 wherein:
the antenna tuning circuit in producing the antenna tuning signal which produces maximum gain executes a recurring process of incrementally changing the antenna tuning signal, storing a resultant received signal strength indicator produced by the intermediate frequency circuit, compares the resultant received signal strength indicator with a received signal strength indicator produced by the intermediate frequency circuit prior to incrementally changing the antenna tuning signal to determine if the incremental change in antenna tuning signal caused the resultant received signal strength indicator from the intermediate frequency circuit to increase; and repeats incremental changing of antenna tuning signal, storing and comparing the resultant and previous received signal strength indicators produced by the intermediate frequency circuit until the received signal strength indicator reaches the maximum.

44. A RF receiver in accordance with claim 42 wherein:
the RF receiver receives channels in at least one frequency band with each frequency band containing a plurality of channels; and
the antenna tuning circuit stores a plurality of fixed magnitude antenna tuning signals with the stored antenna tuning signals being stored prior to receiving the specified channel and applies a single stored antenna tuning signal to the tunable antenna which is a function of the channel specified by the applied channel tuning signal.

45. A RF receiver in accordance with claim 43 wherein:
the channels to which the receiver is tunable are contained in a plurality of frequency bands with a plurality of fixed magnitude antenna tuning signals being stored for each band prior to receiving the specified channel.

46. A RF receiver which is tunable to at least one specified channel having a signal strength which varies as a result of variable antenna gain comprising:
a tunable antenna which is tunable in response to an antenna tuning signal to vary antenna gain for the specified channel;
a RF tuner, coupled to the tunable antenna, for receiving the specified channel in response to an applied channel tuning signal specifying reception of the specified channel;
a circuit, coupled to the RF tuner for producing a received signal strength indicator which is proportional to a level of a signal within the receiver which is proportional to gain of the antenna;
an antenna tuning circuit, responsive to the received signal strength indicator and to a fixed magnitude stored antenna tuning signal which is a function of the channel being received and which was stored prior to receiving the specified channel, for generating the antenna tuning signal which produces maximum antenna gain for the received channel; and
a controller controlling generation of the applied channel tuning signal to cause the RF tuner to be tuned to receive the specified channel.

47. A method of tuning an antenna of an RF receiver comprising:
identifying a channel which is to be received by the RF receiver from a plurality of channels which may be received;
tuning a RF tuner to the channel which was identified;
tuning the antenna responsive to a strength of a signal received on the channel to which the tuner was tuned and a fixed magnitude stored antenna tuning signal which is a function of the channel being received and which was stored prior to receiving the identified channel to produce a maximum antenna gain for the received channel.

48. A method in accordance with claim 47 wherein:
the stored antenna tuning signal produces an antenna gain less than the maximum gain;
the antenna tuning signal is changed from the fixed magnitude stored antenna signal to change the gain of the antenna to produce a maximum strength of a signal received on the channel; and
the antenna tuning signal is set equal to the antenna tuning signal which produced the maximum strength to tune the antenna to produce maximum antenna gain.

49. A method in accordance with claim 48 wherein:
the antenna tuning signal is incrementally changed until the maximum strength of signal is produced.

50. A method in accordance with claim 47 wherein:
the antenna tuning signal is changed to produce a maximum antenna gain a plurality of different times; and
the antenna tuning signal is set equal to the antenna tuning signal which produced the maximum antenna gain during the plurality of different times that a maximum strength was produced to tune the antenna to produce maximum antenna gain.

51. A method in accordance with claim 48 wherein:
the antenna tuning signal is changed to produce a maximum antenna gain a plurality of different times; and
the antenna tuning signal is set equal to the antenna tuning signal which produced the maximum antenna gain during the plurality of different times that a maximum strength was produced to tune the antenna to produce maximum antenna gain.

52. A method in accordance with claim 49 wherein:
the antenna tuning signal is changed to produce a maximum antenna gain a plurality of different times; and
the antenna tuning signal is set equal to the antenna tuning signal which produced the maximum antenna gain during the plurality of different times that a maximum strength was produced to tune the antenna to produce maximum antenna gain.

53. A method in accordance with claim 47 wherein:
channels within only a single frequency band may be received;
a plurality of fixed magnitude antenna tuning signals are stored for the frequency band which may be received prior to receiving the identified channel; and
a single fixed magnitude stored antenna tuning signal is used for producing the maximum antenna gain which is a function of the channel which was identified from the single frequency band.

54. A method in accordance with claim 47 wherein:
channels within a plurality of frequency bands may be received;
a plurality of fixed magnitude antenna tuning signals are stored for each frequency band which may be received prior to receiving the identified channel; and
a single fixed magnitude stored antenna tuning signal is used for producing the maximum antenna gain which is a function of the channel which was identified from one of the frequency bands.

55. A method in accordance with claim 48 wherein:

channels with only a single frequency band may be received;

a plurality of fixed magnitude antenna tuning signals are stored from the frequency band which may be received prior to receiving the identified channel; and a single fixed magnitude stored antenna tuning signal is used for producing the maximum antenna gain which is a function of the channel which was identified from the single frequency band.

56. A method in accordance with claim 48 wherein:

channels within a plurality of frequency bands may be received;

a plurality of fixed magnitude antenna tuning signals are stored from each frequency band which may be received prior to receiving the identified channel; and a single fixed magnitude stored antenna tuning signal is used for producing the maximum antenna gain which is a function of the channel which was identified from one of the frequency bands.

57. A method in accordance with claim 50 wherein:

channels within only a single frequency band may be received;

a plurality of fixed magnitude antenna tuning signals are stored for the frequency band which may be received prior to receiving the identified channel; and a single fixed magnitude stored antenna tuning signal is used for producing the maximum antenna gain which is a function of the channel which was identified from the single frequency bands.

58. A method in accordance with claim 50 wherein:

channels within a plurality of frequency bands may be received;

a plurality of fixed magnitude antenna tuning signals are stored for each frequency band which may be received prior to receiving the identified channel; and a single fixed magnitude stored antenna tuning signal is used for producing the maximum antenna gain which is a function of the channel which was identified from one of the frequency bands.

59. A method of tuning an antenna of an RF receiver comprising:

identifying a channel which is to be received by the RF receiver from a plurality of channels which may be received;

tuning a RF tuner to the channel which was identified;

tuning the antenna responsive to a fixed magnitude stored antenna tuning signal which is a function of the channel being received and which was stored prior to receiving the identified channel to produce a maximum antenna gain for the received channel.

60. A method in accordance with claim 59 wherein:

the stored fixed magnitude antenna tuning signal produces an antenna gain less than the maximum gain;

the antenna tuning signal is changed from the stored antenna signal to change the gain of the antenna to produce a maximum strength of a signal received on the channel; and the antenna tuning signal is set equal to the antenna tuning signal which produced the maximum strength to tune the antenna to produce maximum antenna gain.

61. A method in accordance with claim 60 wherein:

the antenna tuning signal is incrementally changed until the maximum strength of signal is produced.

62. A method in accordance with claim 59 wherein:

the antenna tuning signal is changed to produce a maximum antenna gain a plurality of different times; and the antenna tuning signal is set equal to the antenna tuning signal which produced the maximum antenna gain during the plurality of different times that a maximum strength was produced to tune the antenna to produce maximum antenna gain.

63. A RF receiver in accordance with claim 58 wherein:

the RF receiver is a paging receiver.

64. A method in accordance with claim 61 wherein:

the antenna tuning signal is changed to produce a maximum antenna gain a plurality of different times; and the antenna tuning signal is set equal to the antenna tuning signal which produced the maximum antenna gain during the plurality of different times that a maximum strength was produced to tune the antenna to produce maximum antenna gain.

65. A method in accordance with claim 59 wherein:

channels within only a single frequency band may be received;

a plurality of fixed magnitude antenna tuning signals are stored for the frequency band which may be received prior to receiving the identified channel; and a single fixed magnitude stored antenna tuning signal is used for producing the maximum antenna gain which is a function of the channel which was identified from the single frequency band.

66. A method in accordance with claim 59 wherein:

channels within a plurality of frequency bands may be received;

a plurality of fixed magnitude antenna tuning signals are stored for each frequency band which may be received prior to receiving the identified channel; and a single fixed magnitude stored antenna tuning signal is used for producing the maximum antenna gain which is a function of the channel which was identified from the single frequency bands.

67. A method in accordance with claim 60 wherein:

channels within only a single frequency band may be received;

a plurality of fixed magnitude antenna tuning signals are stored from the frequency band which may be received prior to receiving the identified channel; and a single fixed magnitude stored antenna tuning signal is used for producing the maximum antenna gain which is a function of the channel which was identified from the single frequency band.

68. A method in accordance with claim 60 wherein:

channels within a plurality of frequency bands may be received;

a plurality of fixed magnitude antenna tuning signals are stored from each frequency band which may be received prior to receiving the identified channel; and a single fixed magnitude stored antenna tuning signal is used for producing the maximum antenna gain which is a function of the channel which was identified from one of the frequency bands.

69. A method in accordance with claim 62 wherein:

channels within only a single frequency band may be received;

a plurality of fixed magnitude antenna tuning signals are stored for the frequency band which may be received prior to receiving the identified channel; and a single fixed magnitude stored antenna tuning signal is used for producing the maximum antenna gain which is a function of the channel which was identified from the single frequency band.

70. A method in accordance with claim 62 wherein:

channels within a plurality of frequency bands may be received;

a plurality of fixed magnitude antenna tuning signals are stored for each frequency band which may be received prior to receiving the identified channel; and a single fixed magnitude stored antenna tuning signal is used for producing the maximum antenna gain which is a function of the channel which was identified from one of the frequency bands.

* * * * *